(12) United States Patent
Watkins et al.

(10) Patent No.: US 12,051,795 B2
(45) Date of Patent: Jul. 30, 2024

(54) DIRECT PRINTING OF 3-D MICROBATTERIES AND ELECTRODES

(71) Applicant: University of Massachusetts, Boston, MA (US)

(72) Inventors: James J. Watkins, South Hadley, MA (US); Wenhao Li, Sunderland, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 17/808,229

(22) Filed: Jun. 22, 2022

(65) Prior Publication Data

US 2022/0328802 A1 Oct. 13, 2022

Related U.S. Application Data

(63) Continuation of application No. 16/493,971, filed as application No. PCT/US2018/022997 on Mar. 16, 2018, now Pat. No. 11,387,438.

(Continued)

(51) Int. Cl.
| | |
|---|---|
| *H01M 4/04* | (2006.01) |
| *G03F 7/00* | (2006.01) |
| *H01M 4/131* | (2010.01) |
| *H01M 4/1391* | (2010.01) |
| *H01M 4/36* | (2006.01) |

(Continued)

(52) U.S. Cl.
CPC ........ *H01M 4/0433* (2013.01); *G03F 7/0002* (2013.01); *H01M 4/0404* (2013.01); *H01M 4/0471* (2013.01); *H01M 4/131* (2013.01);

*H01M 4/1391* (2013.01); *H01M 4/366* (2013.01); *H01M 4/505* (2013.01); *H01M 4/622* (2013.01); *H01M 10/0525* (2013.01); *H01M 10/058* (2013.01)

(58) Field of Classification Search
CPC .................................................. H01M 4/0433
See application file for complete search history.

(56) References Cited

U.S. PATENT DOCUMENTS

| 7,186,307 B2 | 3/2007 | Hashimoto et al. |
| 2004/0013982 A1 | 1/2004 | Jacobson et al. |

(Continued)

FOREIGN PATENT DOCUMENTS

| JP | 2007273249 A | 10/2007 |
| JP | 2010097945 A | 4/2010 |

(Continued)

OTHER PUBLICATIONS

Machine translation of document N.*

(Continued)

*Primary Examiner* — Austin Murata
(74) *Attorney, Agent, or Firm* — Schwegman Lundberg & Woessner, P.A.

(57) ABSTRACT

Various embodiments disclosed relate to novel methods of fabricating 3-D Li ion batteries using direct nanoimprint lithography. The present invention includes methods of fabricating high surface area electrodes, including imprint patterning of high aspect ratio parallel grating style electrodes. The method includes coating a substrate with an ink containing nanoparticles and subsequently annealing the ink into a desired pattern.

16 Claims, 12 Drawing Sheets

Related U.S. Application Data

(60) Provisional application No. 62/472,889, filed on Mar. 17, 2017.

(51) Int. Cl.

| | | |
|---|---|---|
| *H01M 4/505* | (2010.01) | |
| *H01M 4/62* | (2006.01) | |
| *H01M 10/0525* | (2010.01) | |
| *H01M 10/058* | (2010.01) | |

(56) References Cited

U.S. PATENT DOCUMENTS

| | | | |
|---|---|---|---|
| 2004/0029041 A1* | 2/2004 | Shih | H01L 21/31144 264/494 |
| 2013/0022868 A1* | 1/2013 | Yang | H01M 4/139 429/232 |
| 2014/0072720 A1* | 3/2014 | Watkins | H01M 6/40 252/521.1 |
| 2016/0126558 A1 | 5/2016 | Lewis et al. | |
| 2018/0205091 A1 | 7/2018 | Kim et al. | |
| 2020/0091498 A1 | 3/2020 | Watkins et al. | |

FOREIGN PATENT DOCUMENTS

| | | |
|---|---|---|
| JP | 2011241100 A | 12/2011 |
| JP | 2013229315 A | 11/2013 |
| JP | 2014534592 A | 12/2014 |
| JP | 2015-138619 * | 7/2015 |
| JP | 2016010965 A | 1/2016 |
| JP | 2016524276 A | 8/2016 |
| WO | WO-2018009363 A1 | 1/2018 |
| WO | WO-2018170474 A1 | 9/2018 |

OTHER PUBLICATIONS

"U.S. Appl. No. 16/493,971, Examiner Interview Summary mailed Dec. 20, 2021", 2 pgs.
"U.S. Appl. No. 16/493,971, Non Final Office Action mailed Mar. 12, 2021", 11 pgs.
"U.S. Appl. No. 16/493,971, Non Final Office Action mailed Jun. 4, 2021", 10 pgs.
"U.S. Appl. No. 16/493,971, Non Final Office Action mailed Nov. 3, 2021", 11 pgs.
"U.S. Appl. No. 16/493,971, Notice of Allowance mailed Mar. 11, 2022", 8 pgs.
"U.S. Appl. No. 16/493,971, Response filed Jan. 25, 2022 to Non Final Office Action mailed Nov. 3, 2021", 10 pgs.
"U.S. Appl. No. 16/493,971, Response filed Aug. 30, 2021 to Non Final Office Action mailed Jun. 4, 2021", 11 pgs.
"European Application Serial No. 18766918.9, Extended European Search Report mailed Mar. 16, 2020", 9 pgs.
"International Application Serial No. PCT/US2018/022997, International Preliminary Report on Patentability mailed Sep. 26, 2019", 9 pgs.
"International Application Serial No. PCT/US2018/022997, International Search Report mailed Jun. 11, 2018", 2 pgs.
"International Application Serial No. PCT/US2018/022997, Written Opinion mailed Jun. 11, 2018", 7 pgs.
"Japanese Application Serial No. 2019-551378, Examiners Decision of Final Refusal mailed Apr. 5, 2022", w/ English translation, 2 pgs.
"Japanese Application Serial No. 2019-551378, Final Notification of Reasons for Refusal mailed Sep. 7, 2021", with English translation, 6 pages.
"Japanese Application Serial No. 2019-551378, Notification of Reasons for Refusal mailed Dec. 15, 2020", w/ English Translation, 15 pgs.
"Japanese Application Serial No. 2019-551378, Response filed Mar. 15, 2021 to Notification of Reasons for Refusal mailed Dec. 15, 2020", w/o English, 15 pgs.

Aspnes, D E, "Local-field effects and effective-medium theory—a microscopic perspective", American Journal of Physics 50, (1982), 7 pgs.
Baggetto, L, et al., "High energy density all-solid-state batteries: A challenging concept towards 3D integration", Adv. Funct. Mater. 18,, (2008), 1057-1066.
Beaulieu, M, et al., "Large-Area Printing of Optical Gratings and 3D Photonic Crystals Using Solution-Processable Nanoparticle/ Polymer Composites", Acs Photonics 1, (Aug. 11, 2014), 799-805.
Billaud, J, et al., "Magnetically aligned graphite electrodes for high-rate performance Li-ion batteries", Nature Energy 1, 16097, (Jul. 4, 2016), 1-6.
Billaud, J, et al., "Promises and challenges of nanomaterials for lithium-based rechargeable batteries", Nature Energy 1, 16071, (Jun. 13, 2016), 1-12.
Chen, J S, et al., "Unusual rutile TiO2 nanosheets with exposed (001) facets", Chemical Science 2, (2011), 2219-2223.
Dokko, K, et al., "Sol-gel fabrication of lithium-ion microarray battery", Electrochemistry Communications 9, (2007), 6 pgs.
Ferrari, S, et al., "Latest advances in the manufacturing of 3D rechargeable lithium microbatteries", J. Power Sources 286, (2015), 25-46.
Gentili, V, "Lithium Insertion into Anatase Nanotubes", Chemistry of Materials 24, (Nov. 1, 2012), 4468-4476.
Goriparti, S, et al., "Review on recent progress of nanostructured anode materials for Li-ion batteries", J. Power Sources 257, (2014), 23 pgs.
Huang, Y G, et al., "Stamp collapse in soft lithography", Langmuir 21, (2005), 8058-8068.
Hwang, J K, et al., "Direct nanoprinting by liquid-bridge-mediated nanotransfer moulding", Nat. Nanotechnol. 5, (2010), 742-748.
Kim, et al., "Fabrication of a conductive nanoscale electrode for functional devices using nanoimprint lithography with printable metallic nanoink", Microelectronic Engineering, vol. 87, (Jan. 4, 2010), 839-842.
Kim, E, et al., "Micromolding in capillaries: Applications in materials science.", . J. Am. Chem. Soc. 118, (1996), 5722-5731.
Kothari, Rohit, et al., "Direct Patterning of Robust One-Dimensional, Two-Dimensional, and Three-Dimensional Crystalline Metal Oxide Nanostructures Using Imprint Lithography and Nanoparticle Dispersion Inks", Chemistry of Materials, 29(9), ACS Publications, (2017), 3908-3918.
Lavan, D A, et al., "Small-scale systems for in vivo drug delivery", Nature Biotechnology vol. 21, (Oct. 2003), 1184-1191.
Lin, F, et al., "Metal segregation in hierarchically structured cathode materials for high-energy lithium batteries.", Nature Energy 1, 15004, (Jan. 11, 2016), 1-8.
Liu, H, et al., "Mesoporous TiO2-B Microspheres with Superior Rate Performance for Lithium Ion Batteries", Adv. Mater. 23, (2011), 3450-3454.
Liu, J H, et al., "Sandwich-Like, Stacked Ultrathin Titanate Nanosheets for Ultrafast Lithium Storage", Adv. Mater. 23, (2011), 998-1002.
Long, J W, et al., "Three-dimensional battery architectures", Chemical Reviews 104, (Aug. 19, 2004), 4463-4492.
Mahmood, N, et al., "Nanostructured Anode Materials for Lithium Ion Batteries: Progress, Challenge and Perspective", Advanced Energy Materials 6, 22, (2016), 1-22.
Ning, H, et al., "Holographic patterning of high-performance on-chip 3D lithium-ion microbatteries", Proceedings of the National Academy of Sciences 112,, (May 26, 2015), 6 pgs.
Nitta, N, et al., "Li-ion battery materials: present and future", Materials Today, vol. 18, No. 5, (Jun. 2015), 252-264.
Notten, P H, et al., "3-D integrated all-solid-state rechargeable batteries", Adv. Mater. 19, (2007), 4564-4567.
Park, S J, et al., "Synthesis of carbon-coated TiO2 nanotubes for high-power lithium-ion batteries.", J. Power Sources 196, (2011), 5 pgs.
Rai, A K, et al., "Simple synthesis and particle size effects of TiO2 nanoparticle anodes for rechargeable lithium ion batteries.", Electrochimica Acta 90, (2013), 7 pgs.
Roberts, M, et al., "3D lithium ion batteries-from fundamentals to fabrication.", J. Mater. Chem. 21, (2011), 15 pgs.

(56) References Cited

OTHER PUBLICATIONS

Spearing, S M, "Materials issues in microelectromechanical systems (MEMS)", Acta Mater. 48, (2000), 18 pgs.

Subramanyam, G, et al., "Challenges and opportunities for multifunctional oxide thin films for voltage tunable radio frequency/microwave components", J. Appl. Phys. 114, 35, (2013), 36 pgs.

Suh, Ky, et al., "Capillary force lithography", Adv. Mater. 13, (Sep. 14, 2001), 1386-1389.

Sun, K, et al., "3D Printing of Interdigitated Li-Ion Microbattery Architectures", Adv. Mater. 25, (2013), 4539-4543.

Tarascon, J.-M., et al., "Issues and Challenges Facing Rechargeable Lithium Batteries", Nature, 414, (2001), 359-367.

Van De Krol, R, et al., "Spatial extent of lithium intercalation in anatase TiO2.", Journal of Physical Chemistry B 103, (1999), 7151-7159.

Vu, A, et al., "A. Porous Electrode Materials for Lithium-Ion Batteries—How to Prepare Them and What Makes Them Special.", Advanced Energy Materials 2, (2012), 1056-1085.

Wang, J, et al., "Fast lithium-ion insertion of TiO2 nanotube and graphene composites", Electrochimica Acta 88, (2013), 11 pgs.

Wang, X R, et al., "Chemical vapor deposition and atomic layer deposition for advanced lithium ion batteries and supercapacitors", Energy Environ. Sci. 8, (2015), 1889-1904.

Xia, Younan, et al., "Soft Lithography", Angewandte Chemie International Edition 37(5), (Mar. 16, 1998), 26 pgs.

Xu, W, et al., "Nanoporous anatase TiO2/single-wall carbon nanohorns composite as superior anode for lithium ion batteries.", J. Power Sources 232, (2013), 6 pgs.

Yan, et al., "Preparation and electrochemical properties of composites of carbon nanotubes loaded with Ag and TiO2 nanoparticles for use as anode material in lithium-ion batteries", (2008), 5 pgs.

Yu, X Y, et al., "Rutile TiO2 Submicroboxes with Superior Lithium Storage Properties", Angew. Chem.—Int. Edit. 54, (2015), 4001-4004.

Zhang, G Q, et al., "TiO2 Hollow Spheres Composed of Highly Crystalline Nanocrystals Exhibit Superior Lithium Storage Properties", Angew. Chem.—Int. Edit. 53, (Aug. 14, 2014), 12590-12593.

Zhang, H G, et al., "Three-dimensional bicontinuous ultrafast-charge and -discharge bulk battery electrodes", Nat. Nanotechnol. 6, (2011), 277-281.

Zhang, Y, et al., "Replica molding of high-aspect-ratio polymeric nanopillar arrays with high fidelity", Langmuir 22, (Sep. 2, 2006), 8595-8601.

\* cited by examiner

DIRECT PRINTING OF 3-D MICROBATTERIES AND ELECTRODES

CROSS-REFERENCE TO RELATED APPLICATION

This application is a continuation of U.S. patent application Ser. No. 16/493,971, filed on Sep. 13, 2019, which is a U.S. National Stage Filing under 35 U.S.C. 371 from International Application No. PCT/US2018/022997, filed on Mar. 16, 2018, which claims the benefit of priority to U.S. Provisional Patent Application Ser. No. 62/472,889 entitled "METHODS OF DIRECT PRINTING 3-D MICROBATTERIES AND ELECTRODES," filed Mar. 17, 2017, the disclosures of which are incorporated herein in their entirety by reference.

STATEMENT OF GOVERNMENT SUPPORT

This invention was made with Government support under grant CMMI-1025020 awarded by National Science Foundation. The U.S. Government has certain rights in this invention.

BACKGROUND

The trend of device downscaling drives a corresponding need for power source miniaturization. As footprint area is the determining form factor for on-chip battery systems, enhancement of areal energy and power density is desirable. Due to geometric constraints, it is impractical for a conventional thin film battery to possess high capacity and power simultaneously.

Patterned metal oxide and semiconductor films are ubiquitous in functional device architectures. Typical fabrication pathways are subtractive by nature and contain multiple steps, including deposition of a planar film by chemical or physical deposition methods such sputtering or chemical vapor deposition (CVD), application of a photoresist, patterning of the resist using optical lithography, development of the resist, etching the metal oxide and stripping of the residual resist.

The fabrication sequence is usually carried out in a clean room facility and uses batch processes, some of which operate at elevated temperatures and reduced pressures. Consequently, patterned inorganic film fabrication is often cost, equipment, materials and energy intensive and is not amendable to continuous as opposed to batch fabrication. Though numerous microfabrication methods lead to successful creation of submillimeter-scale electrodes, scalable approaches that provide cost-effective nanoscale resolution for energy storage devices such as on-chip batteries remain elusive.

SUMMARY OF THE INVENTION

In various embodiments, a method of fabricating an electrode is provided. The method includes depositing an ink having electroactive nanoparticles, and optionally at least one conductive additive, on a substrate having an electrical contact to form a film, stamping the film with a mold to form a patterned film; and annealing the patterned film to form an electrode.

In various embodiments, a method of fabricating electrodes includes spin-coating an ink having about 3 wt % $TiO_2$ nanoparticles, having number-averaged and volume-averaged particle sizes of about 10 nm to about 20 nm, dispersed in an alcohol solvent on a gold contact formed on a silicon dioxide substrate to form a film, stamping the film with a mold to form a film having a parallel grating pattern, where the grating pattern has a spacing of about 1 µm, and each grating has a height of about 0.01 µm to about 0.25 µm and a width of about 0.01 µm to about 0.25 µm. The patterned film is annealed to form an electrode layer, and planarized by depositing at least one layer of a crosslinkable pre-polymer photoresist on the electrode layer, followed by curing the photoresist to form a planarized layer. At least five additional electrodes are formed by additional cycles of the spin-coating, the stamping, the annealing, the planarizing, and the curing, where in each successive cycle the parallel grating pattern is formed perpendicular to and overlapping the previously deposited grating pattern.

In various embodiments, a method of fabricating electrodes includes depositing a first ink having electroactive nanoparticles, and optionally at least one conductive additive, on a substrate to form a film, stamping the film with a mold to form a parallel grating structure, annealing the grating structure to form a cathode, coating the cathode with a layer of polymer separator, backfilling the spaces between the grating in the parallel grating structure with a second ink having electroactive nanoparticles, and optionally at least one conductive additive, to form an anode, and curing to form electrodes.

In various embodiments, a method of fabricating electrodes includes spin-coating a first ink having 4-hydroxybenzoic acid and 10 wt % of LMO ($LiMn_2O_4$) nanoparticles dispersed in a mixture of methanol and N-methyl-2-pyrrolidone on an ITO (indium tin oxide) substrate to form a film, stamping the film with a mold to form a parallel grating structure, where the grating structure has a spacing of about 10 µm, and each grating has a height of about 0.25 µm to about 2.5 µm and a width of about 2 µm to about 6 µm, annealing the grating structure to form a cathode, spin-coating the cathode with a solution of poly (dopamine acrylamide)-co-poly (ethylene glycol) methyl ether methacrylate (PDMA-co-$PEG_{500}$), to form a polymer separator, backfilling the spaces between the grating in the parallel grating structure with a second ink having LTO ($Li_4Ti_5O_{12}$) nanoparticles, mesoporous carbon, and polyvinylpyrrolidone in a dispersion of de-ionized water, ethanol, and ethylene glycol to form an anode, and curing to a form electrodes.

Advantageously, a novel and scalable approach to the fabrication of 3-D Li ion batteries has been developed using direct imprinting (nanoimprint lithography) approaches to the fabrication of high surface area electrodes. Additionally, high surface area single layer devices can be produced by imprint patterning of high aspect ratio parallel grating style electrodes with dimensions and pitches on the micron scale using nanoparticle based inks, followed by simple coating of the electrodes with a separator/electrolyte, followed by infilling the remaining gap with nanoparticles to comprise the counter electrode.

Surprisingly, it has been discovered that a novel 3D woodpile electrode, made from nanoparticle (NP) based inks using nanoimprint lithography can remarkably enhance both the capacity and power of a lithium-ion battery. With the convenience of sequential imprinting, woodpile electrodes of different heights are readily made in a "stack-up" manner, resulting in a proportional increase of capacity, which is not possible in conventional thin film batteries. These 3D electrodes have superior rate performance with 1.5- to 6-fold improvement of the specific capacity (compared to their 2D counterparts) during fast cycling (up to 15 C) at least in part due to the structures' large surface area.

In summary, a 3D microbattery based on LMO/LTO NPs, has been fabricated by solvent-assisted imprinting. The small size and refined crystallinity of NPs, together with the well-engineered device architecture, enables the battery to display both high volumetric energy and power density. With the ease of imprinting and layer-by-layer integration, the methods described here can be expanded to other electrochemical couples. These microbatteries can have applications in the next-generation autonomously powered devices and other electronics.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments of the present invention.

DETAILED DESCRIPTION OF THE INVENTION

Figure 1A:
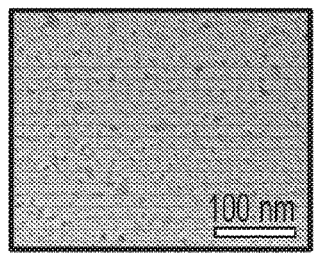
FIG. 1A is a transmission electron microscope (TEM) image of $TiO_2$ nanoparticles, in accordance with various embodiments.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section. All publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that the composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less. The term "substantially free of" can mean having a trivial amount of, such that a composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less, or about 0 wt %.

The term "radiation" as used herein refers to energetic particles travelling through a medium or space. Examples of radiation include visible light, infrared light, microwaves, radio waves, very low frequency waves, extremely low frequency waves, thermal radiation (heat), and black-body radiation.

The term "UV light" as used herein refers to ultraviolet light, which is electromagnetic radiation with a wavelength of about 10 nm to about 400 nm.

The term "cure" as used herein refers to exposing to radiation in any form, heating, or allowing to undergo a physical or chemical reaction or process that results in hardening or an increase in viscosity. A flowable thermoplastic material can be cured by cooling it such that the material hardens. A thermoset material can be cured by heating or otherwise exposing to irradiation such that the material hardens.

The term "solvent" as used herein refers to a liquid that can dissolve a solid, liquid, or gas. Non-limiting examples of solvents are silicones, organic compounds, water, alcohols, ionic liquids, and supercritical fluids.

The term "partially" as used herein refers to a process that is not fully complete. The process can be about 10%, about 20%, about 30%, about 40%, about 50%, about 60%, about 70%, about 80%, about 90%, or about 95% complete, or any range or sub-range of these values.

The term "alkyl" as used herein refers to straight chain and branched alkyl groups and cycloalkyl groups having from 1 to 40 carbon atoms, 1 to about 20 carbon atoms, 1 to 12 carbons or, in various embodiments, from 1 to 6 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl.

The term "electroactive" as used herein refers to the property of electrochemical activity of a substance. Electrochemically active substances can undergo electrochemical reactions, including electrochemical reactions such as oxidation, reduction, lithiation, or delithiation, when subjected to an electric stimulus. Suitable electroactive substances can include $TiO_2$, LMO, LTO, $Fe_2O_3$, and combinations thereof.

The term "conductive additive" as used herein refers to a substance that does not participate in an electrochemical reaction (is not electroactive), but can assist in facilitating the electrochemical process by, for example, facilitating electron transport. Suitable conductive additives can include carbon additives such as mesoporous carbon nanopowder, and carbon nanotubes.

In various embodiments, a method of fabricating an electrode is provided. The method includes depositing an ink having electroactive nanoparticles on a substrate having an electrical contact to form a film, stamping the film with a mold to form a patterned film; and annealing the patterned film to form an electrode.

In various embodiments the substrate is a silicon dioxide wafer. The substrate can be any suitable non-conductive and non-reactive substrate, such as, glass, quartz, or polymeric resins such as PET sheets or polyimide sheets.

The electrical contact can include any electrically conductive material suitable for use in electronics applications, for example, the electrical contact can be silver, copper, nickel, indium tin oxide, aluminum or combinations thereof. In various embodiments, the electrical contact is gold.

In various embodiments, the ink is deposited by spin-coating or drop casting. The spin-coating can be performed at about 1000-5000 rpm under inert atmosphere. Inert atmospheres include gases that do not substantially react with any component used in the methods described herein. Suitable inert atmospheres can include nitrogen, argon, and mixtures thereof. In various embodiments, the inert atmosphere can also contain sufficient water content to have about 1-10% humidity, or about 1%, 2%, 3%, 4%, or 5% humidity. In various embodiments, the spin-coating is performed at about 2000 to 4000 rpm, or about 2500 to 3500 rpm, or about 3000 rpm. In various embodiments, the inert atmosphere is a nitrogen atmosphere.

In various embodiments, any of the inks described herein can be any conductive non-metal, metal, or metal oxide, including, without limitation, silver, gold, zinc oxide, carbon nanotubes (single-walled and multi-walled). In various embodiments, any of the inks described herein can be composed of a dispersion of metal oxide nanoparticles. The dispersion can be a homogenous dispersion, and can be stable (i.e. little to no precipitation) for at least 1 month, 2 months, 3 months, or more. The dispersion can have a viscosity of about 1.05 to about 2.0 times the viscosity of the solvent mixture without the metal oxide nanoparticles, or about 1.1, 1.2, 1.3, 1.4, 1.5, 1.6, 1.7, 1.8, or 1.9 times the viscosity of the solvent mixture without the metal oxide nanoparticles.

In various embodiments, the metal oxide nanoparticles have number-averaged and volume-averaged particle sizes of about 10 nm to 20 nm. In various embodiments, the metal oxide nanoparticles have number-averaged particle sizes of about 10 nm to 15 nm, or about 11 to 14 nm, or about 12 to 13 nm. In various embodiments, the metal oxide nanoparticles have volume-averaged particle sizes of about 12 to 20 nm, or about 13 to 19 nm, or about 13 to 18 nm, or about 14 to 17 nm, or about 15 to 17 nm. In various embodiments, the metal oxide nanoparticles are crystalline.

In various embodiments, the dispersion contains about 1-25 wt % of the metal oxide nanoparticles. The dispersion can contain about 1, 2, 3, 4, or 5 wt % of the metal oxide nanoparticles. In various embodiments, the metal oxide nanoparticles are $TiO_2$. In various embodiments, the nanoparticles are $LiMn_2O_4$ or $LiTi_5O_{12}$, or mixtures thereof. In various embodiments, the average size of the nanoparticles, which is the largest dimension in the nanoparticles, is between about 1 and 25 nm, or about 2, 3, 4, 5, 6, 7, 8, 9, 10, 11, 12, 113, 14, 15, 16, 17, 18, 19, 20, 21, 22, 23, 24, or 25 nm. In various embodiments, the average size of the nanoparticles is from about 2 to 18 nm, about 3 to 17 nm, about 4 to 15 nm, about 5 to 13 nm, or about 6 to 11 nm.

In various embodiments, the dispersion includes an alcohol solvent as the liquid phase. The alcohol can be any suitable $C_{1-6}$ alkyl alcohol, including $C_{1-6}$ alkyl diols. For example, the alcohol can be methanol, ethanol, 1-propanol, 2-propanol, 1-butanol, 2-butanol, 1-pentanol, 2-pentanol, 3-pentanol, and mixtures thereof. The diol can be ethylene glycol, 1,2-propanediol, butane diol (1,2 or 1,3, or 1,4), and mixtures thereof. In various embodiments, the alcohol is methanol, 1,2-propanediol, or mixtures thereof. Without being bound by theory, the use of methanol can provide a variety of advantages, including lowering ink viscosity and improving wettability to facilitate film formation, fast evaporation during spin coating allowing for rapid concentration the ink, and the evaporation-induced composition change of the ink does not lead to severe particle aggregation due at least in part to good miscibility.

In various embodiments, the patterned film has a parallel grating pattern. In various embodiments, the spacing between the gratings is about 0.05 to 100 μm. The spacing between gratings can be about 0.75, 1.0, 1.25, 1.5, 1.75, 2.0, 2.5, 3.0, 3.5, 4.0, 4.5, 5.0, 5.5, or 6.0 μm. In various embodiments, the spacing between the gratings is less than 100 μm, less than 75 μm, less than 50 μm, less than 25 μm, less than 10 μm, less than 5 μm, less than 2.5 μm, less than 1 μm, less than 0.5 μm, less than 0.25 μm, less than 0.1 μm, or less than 0.05 μm.

In various embodiments, the patterned film has a serpentine line shape, zig-zag line shape, grid shape, concentric circle shapes, or a regular polygon shape, such as a triangle, square, pentagon, hexagon, etc. The spacing between the shape or line can be less than 100 μm, less than 75 μm, less than 50 μm, less than 25 μm, less than 10 μm, less than 5 μm, less than 2.5 μm, less than 1 μm, less than 0.5 μm, less than 0.25 μm, less than 0.1 μm, or less than 0.05 μm.

In various embodiments the width of each grating is from about 0.01 μm to about 25 μm. In various embodiments, each grating has a width of about 0.05, 0.075, 0.1, 0.125, 0.15, or 0.175 μm. In various embodiments, the width of each grating is less than about 25 μm, less than about 20 μm, less than about 15 μm, less than about 10 μm, less than about 5 μm, or less than about 3 μm, or any range or sub-range in between these values.

In various embodiments, the height of each grating is from about 0.01 μm to 25 μm. In various embodiments, the height of each grating is about 0.05, 0.075, 0.1, 0.125, 0.15, or 0.175 μm. In various embodiments, the thickness of each grating is less than about 25 μm, less than about 20 μm, less than about 15 μm, less than about 10 μm, less than about 5 μm, or less than about 3 μm. In various embodiments, the grating pattern is formed from annealed $TiO_2$ nanoparticles.

In various embodiments, the method further includes planarizing the electrode by depositing at least one layer of a crosslinkable pre-polymer photoresist on the electrode, followed by curing to form a planarized layer. The planarized layer can be substantially flat.

In various embodiments, the method further includes forming additional electrodes by performing additional cycles of the depositing, the stamping, the annealing, the planarizing, and the curing. In each successive cycle the parallel grating pattern is formed perpendicular to and overlapping the previously deposited grating pattern.

The three-dimensional electrode can be formed from 1, 2, 3, 4, 5, 6, 7, 8, 9, or 10 electrode layers. In various embodiments, up to six total electrode layers are deposited to form a three-dimensional electrode. In various embodiments, the three-dimensional electrode is substantially free of organic material after curing. In various embodiments, the three-dimensional electrode has a porosity of about 25% to about 35% as calculated by the Lorentz-Lorentz equation.

In various embodiments, the specific capacity of the three-dimensional electrode is proportional to the number of electrode layers. For example, the capacity of a single electrode layer can be from about 6.0 to about 9.0 μAh. In various embodiments, the areal energy density of a single electrode layer is from about 4.0 to about 7.0 $\mu Whcm^{-2}$.

In various embodiments, a battery can be formed from a counter electrode, a liquid electrolyte, and at least one electrode made by a method that includes depositing an ink having electroactive nanoparticles on a substrate having an electrical contact to form a film, stamping the film with a mold to form a patterned film, and annealing the patterned film to form an electrode. In various embodiments, the liquid electrolyte permeates the electrode.

In various embodiments, a method of fabricating electrodes includes spin-coating an ink having about 3 wt % $TiO_2$ nanoparticles, having number-averaged and volume-averaged particle sizes of about 10 nm to about 20 nm, dispersed in an alcohol solvent on a gold contact formed on a silicon dioxide substrate to form a film, stamping the film with a mold to form a film having a parallel grating pattern, where the grating pattern has a spacing of about 1 μm, and each grating has a height of about 0.01 μm to about 0.25 μm and a width of about 0.01 μm to about 0.25 μm. The patterned film was annealed to form an electrode layer, and planarized by depositing at least one layer of a crosslinkable pre-polymer photoresist on the electrode layer, followed by curing the photoresist to form a planarized layer. At least five additional electrodes are formed by additional cycles of the spin-coating, the stamping, the annealing, the planarizing, and the curing, where in each successive cycle the parallel grating pattern is formed perpendicular to and overlapping the previously deposited grating pattern.

In various embodiments, a method of fabricating electrodes includes depositing a first ink having electroactive nanoparticles on a substrate to form a film, stamping the film with a mold to form a stamped structure, annealing the stamped structure to form a first electrode depositing on the first electrode at least one layer of a separator, backfilling the stamped structure with a second ink having electroactive nanoparticles to form a second electrode.

In various embodiments, the substrate can be a non-conductive and non-reactive substrate, such as, glass, quartz, or polymeric resins such as PET (polyethylene terephthalate) sheets or polyimide sheets. In various embodiments, the substrate is an indium tin oxide (ITO) coated glass silicon dioxide. In various embodiments the substrate is a silicon dioxide wafer.

In various embodiments, the stamped structure is a parallel grating. The stamped structure can have a shape chosen from serpentine lines, parallel zig-zag lines, grid structures, concentric circles, regular polygons, or combinations thereof. The first electrode can have the shape of the patterned film. When the first electrode is the cathode, the second electrode is the anode. Alternatively, when the first electrode is the anode, the second electrode is the cathode. In various embodiments, the shape is patterned on a substrate in a periodic pattern using a single shape, or more than one shape.

In various embodiments, the first ink is deposited by spin-coating. In various embodiments, the spin-coating is performed at about 200 to about 800 rpm, or at about 300, 400, 500, 600, or 700 rpm.

In various embodiments, the metal oxide nanoparticles of the first ink have number-averaged and volume-averaged particle sizes of about 1 nm to about 25 nm. In various embodiments, the metal oxide nanoparticles of the first ink have number-averaged particle sizes of about 10 nm to 15 nm, or about 11 to 14 nm, or about 12 to 13 nm. In various embodiments, the metal oxide nanoparticles of the first ink have volume-averaged particle sizes of about 12 to 20 nm, or about 13 to 19 nm, or 13 to 18 nm, or about 14 to 17 nm, or about 15 to 17 nm. In various embodiments, the metal oxide nanoparticles are crystalline. In various embodiments, the average size of the nanoparticles of the first or second ink, which is the largest dimension in the nanoparticles, is between about 1 and 10 nm, or about 2, 3, 4, 5, 6, 7, 8, or 9 nm.

In various embodiments, the dispersion contains about 5 to about 25 wt % of the first ink metal oxide nanoparticles. The dispersion can contain about 5 to 15, about 5 to 12, or about 5 to 11 wt % of the nanoparticles of the first ink. The dispersion can contain about 5, 6, 7, 8, 9, 10, 12, or 13 wt % of the nanoparticles of the first ink. In various embodiments, the metal oxide nanoparticles of the first ink are $LiMn_2O_4$ (LMO). The first ink dispersion can have a viscosity of about 1.0 to 5.0 mPa s, or a viscosity of about 1.0, 1.2, 1.4, 1.6, 1.8, 2.0, 2.2, 2.4, 2.6, 2.8, 3.0, 3.2, 3.4, 3.6, 3.8, 4.0, 4.2, 4.4, 4.6, 4.8 or 6.0 mPa s. The LMO nanoparticles can form non-aggregating clusters having number-averaged particle sizes of between about 50 to 500 nm, or about 50 to 300 nm, or about 100 to 200 nm in any of the solvents described herein, such as N-methyl-2-pyrrolidone (NMP).

In various embodiments, the dispersion has an organic solvent liquid phase. The organic solvent can be an alcohol solvent, a non-polar aprotic solvent, or a mixture thereof. In various embodiments, the organic solvent is a mixture methanol and NMP. In various embodiments, the dispersion contains 4-hydroxybenzoic acid.

The second ink dispersion can include mesoporous carbon and an organic solvent. In various embodiments, the organic solvent is a mixture of de-ionized water, ethanol, and ethylene glycol. The de-ionized water, ethanol, and ethylene glycol can be present in any suitable ratio, such 1 to 20:1 to 20:1 to 20 de-ionized water:ethanol:ethylene glycol. For example, the de-ionized water, ethanol, and ethylene glycol can be present in a 16:8:1 v/v ratio.

The second ink dispersion can also include an aqueous polymer binder. The binder can be any suitable binder such as polyvinylpyrrolidone. Other binders that are water soluble are also suitable for use with the second ink dispersion, including, poly(acrylic acid) (PAA). In various embodiments, the mesoporous carbon, the metal oxide nanoparticles, and the binder are present in a 1:1:1 ratio in the second ink by weight. In various embodiments, the metal oxide nanoparticles in the second ink are $Li_4Ti_5O_{12}$ (LTO).

In various embodiments, the spacing between the gratings is about 5 to about 25 µm. In various embodiments, the spacing between the gratings is about 7 to 20 µm, or about 8 to about 15 µm, or about 9 to about 13 µm. In various embodiments, the spacing between the gratings is about 7, 8, 9, 10, 11, 12, or 13 µm.

In various embodiments, the height of each grating is from about 0.5 to about 25 µm. In various embodiments, the height of each gating is about 0.75, 1.0, 1.25, 1.5, 1.75, 2.0, 2.25, 3, 4, 5, 10, 12, 15, 17, 19, 21, 22, or 25 µm. In various embodiments, the width of each grating is from about 0.5 to 25 µm. In various embodiments, the width of each gating is about 0.75, 1.0, 1.25, 1.5, 1.75, 2.0, 2.25, 3, 4, 5, 10, 12, 15, 17, 19, 21, 22, or 25 µm.

In various embodiments, the separator is deposited by ionized CVD. In various embodiments, the separator is deposited from a vapor phase. In various embodiments, the separator comprises at least one poly(p-xylene) polymer. The separator can include any suitable Parylene (poly(p-xylene)) polymer, such as, without limitation, Parylene C, Parylene A, Parylene N, Parylene SF, Parylene D, Parylene X, and combinations thereof.

In various embodiments, the separator is a polymer separator composed of polymer brushes grafted onto the first electrode. In various embodiments, where the grafting results in covalent bonding between the polymer and the first. In various embodiments, the grafting results in non-covalent bonding (e.g. such as electrostatic, hydrogen bonding, or ionic bonding etc.) of the polymer to the electrode. In various embodiments, the polymer separator is anchored onto the first electrode facilitated by dopamine acrylamide (DMA) polymerization. In various embodiments, the grafting of the polymer is accomplished by polymerization of monomers initiated by an active site on the first or an initiating site deposited on the first. In various embodiments, the separator is deposited on the electrode by electrochemical polymerization.

In various embodiments, the polymer separator is coated using spin-coating. In various embodiments, the polymer separator includes the polymerization product of a UV-curable slide-ring resin in a propylene glycol methyl ether acetate (PGMEA) solution. In various embodiments, the polymer separator adheres to the cathode. In various embodiments, the slide-ring polymer can be any commercially available curable polymer glycol such as the SeRM Series polymers available from ASMI Japan, including, without limitation, SH3400P, SH2400P, SH131OP, SM3403P, SM1313P, SA3403P, SA2403P, SA1313P, SM3400C, SA3400C, SA2400C, SH3400S, SH3400M series polymers, and combinations of these polymers. The polymer separator can be coated using spin-coating, or another suitable technique, with solution of a poly(dopamine acrylamide)-co-poly (ethylene glycol) methyl ether methacrylate (PDMA-c0-PEG$_{500}$) as described herein. In various embodiments, the second ink coats the polymer separator.

In various embodiments, a method of fabricating electrodes, includes depositing a first ink having electroactive nanoparticles on a substrate to form a film, depositing a separator layer on the film to form a bilayer, stamping the bilayer with a mold to form a stamped structure, annealing the stamped structure to form a first electrode, backfilling the stamped structure with a second ink having electroactive nanoparticles to form a second electrode.

In various embodiments, the separator layer comprises monomers, macromonomers, or a prepolymer. Suitable monomers, macromonomers, and prepolymers include compounds containing polymerizable groups, including vinyl, acrylate, urethane, isocyanate, acetylenyl, ester, and amide. In various embodiments, the separator layer comprises a polymer. In various embodiments, the separator layer is crosslinked or cured by heating of exposure to electromagnetic radiation. In various embodiments, the separator layer is partially crosslinked or partially cured. In various embodiments, the separator layer is further crosslinked or cured after stamping. In various embodiments, the separator layer comprises porous particles. In various embodiments, the porous particles are organic or inorganic.

In various embodiments, the crosslinking is accomplished using suitable crosslinking agents known in the art, including acrylates, epoxides, acrylamides, and divinylbenzenes. In various embodiments, the curing is thermal curing or exposure to electromagnetic radiation such as UV-light.

In various embodiments, a battery is formed from a liquid electrolyte and fabricated by a method that includes depositing a first ink including electroactive nanoparticles on a substrate to form a film, stamping the film with a mold to form a parallel grating structure, annealing the grating structure to form a cathode, coating the cathode with a layer of polymer separator, backfilling the spaces between the grating in the parallel grating structure with a second ink having electroactive nanoparticles, and optionally at least one conductive additive, to form an anode.

In various embodiments, a method of fabricating electrodes includes spin-coating a first ink having 4-hydroxybenzoic acid and 10 wt % of LMO nanoparticles dispersed in a mixture of methanol and N-methyl-2-pyrrolidone on an ITO substrate to form a film, stamping the film with a mold to form a parallel grating structure, where the grating structure has a spacing of about 10 µm, and each grating has a height of about 0.25 µm to about 2.5 µm and a width of about 2 µm to about 6 µm, annealing the grating structure to form a cathode, spin-coating the cathode with a solution of poly (dopamine acrylamide)-co-poly (ethylene glycol) methyl ether methacrylate (PDMA-co-PEG$_{500}$), to form a polymer separator, backfilling the spaces between the grating in the parallel grating structure with a second ink having LTO nanoparticles, mesoporous carbon, and polyvinylpyrrolidone in a dispersion of de-ionized water, ethanol, and ethylene glycol to form an anode.

In various embodiments, an electrode made by any of the methods disclosed herein is provided. In various embodiments, an electronic device having at least one electrode or battery made by any of the methods disclosed herein is provided. The electronic device may be any device that requires the use of batteries, electrodes, or microelectrodes, and can include, without limitation, cellphones, radio transmitters and receivers, batteries, computers, appliances such as refrigerators, automobiles, boats, planes, cameras, headphones, tablets, children's toys, medical equipment, sensors, and the like.

EXAMPLES

Various embodiments of the present invention can be better understood by reference to the following Examples which are offered by way of illustration. The present invention is not limited to the Examples given herein.

A series of imprinted woodpile 3D lithium-ion battery (LIB) electrodes with aspect ratios ranging from 1 to 6 were fabricated starting from the titanium dioxide nanoparticle dispersions described herein. The electrode can be made by performing multiple "imprint-planarize" cycles. The total capacity and areal energy density were in almost perfect proportion to the number of imprinted layers. Little evidence of specific capacity decrease was observed as the structure height increased by stacking additional layers. The TiO$_2$ woodpile is thus a strong candidate for the anode of a high-performance LIB. More importantly, unlike an aperiodic mesoporous 3D structure, the woodpile is built in a more controlled manner, making it practical to be integrated into a 3D battery. Advantageously, the inventive batteries demonstrate the potential of NIL as a platform technology to create architectures to be applied in energy storage devices.

Fabricated 3D TiO$_2$ woodpile electrodes of high aspect ratios for lithium ion batteries can be made using solvent-assisted NIL. The "stack-up" method enables the areal energy density to be readily multiplied (from 3.6 µWhcm$^{-2}$ to 21.3 µWhcm$^{-2}$) and the rate performance to be significantly improved by factors of 1.5 to 6 upon increasing discharge rates from 1.5 C to 15 C.

Example 1. Fabrication of a PDMS Mold

Patterned PDMS stamps were fabricated by casting PDMS against silicon or silicon dioxide master molds with a line grating pattern (line width, —425 nm; pitch, —950 nm; height, —480 nm). The PDMS elastomer mixture (10:1 weight ratio of Sylgard 184 silicone elastomer base and curing agent) was mixed and degassed in vacuum oven for 1 hour at room temperature. Then the mixture was poured onto the master mold and placed at 70° C. for 5 h in an oven. After curing, PDMS stamps were obtained via peeling off from master mold.

Example 2. Preparation and Characterization of Titanium Dioxide Ink

To make an ink suitable for imprinting, nanoparticle size and dispersion, solid concentration, and ink viscosity are among the important factors. In various embodiments, the imprint ink is made from a commercially available TiO$_2$ nanoparticle (anatase, 20 wt %) dispersion in 1,2-propanediol (US Research Nanomaterials, Inc.). This mixture was further vortex-mixed and sonicated for a few minutes to obtain a stable, well-dispersed ink. Particle size and distribution were checked by TEM (JEOL 2000FX) and Malvern Nano Zetasizer.

Figure 1B:
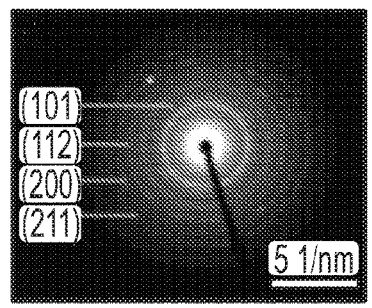
FIG. 1B is an electron diffraction pattern of $TiO_2$ nanoparticles, in accordance with various embodiments.
Figure 1C:
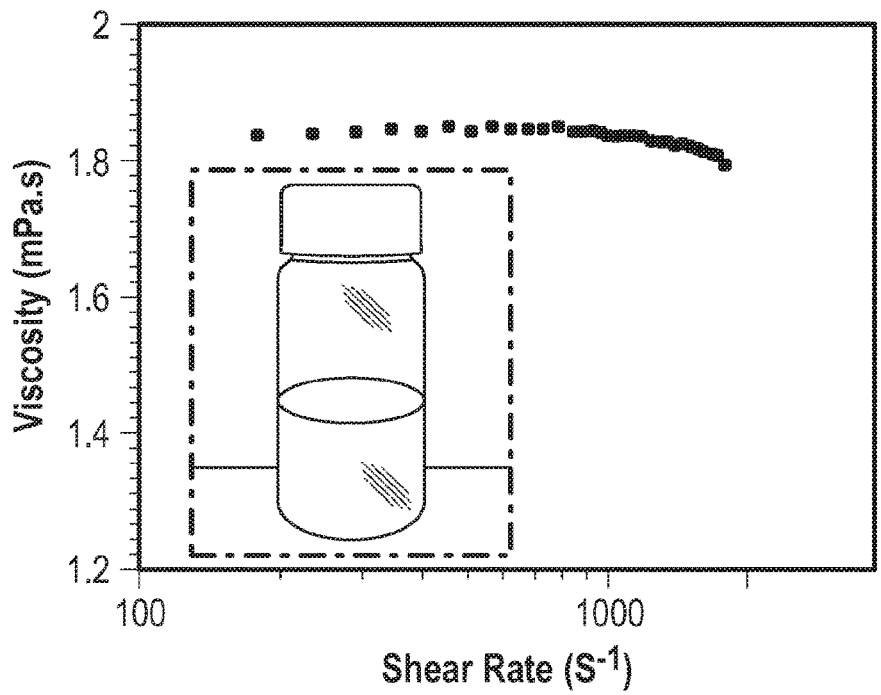
FIG. 1C is a plot of shear viscosity of the $TiO_2$ ink measured at room temperature under a shear rate between 100 and 1000 $s^{-1}$ (a photo of a 3 wt % dispersion is inset), in accordance with various embodiments.
Figure 1D:
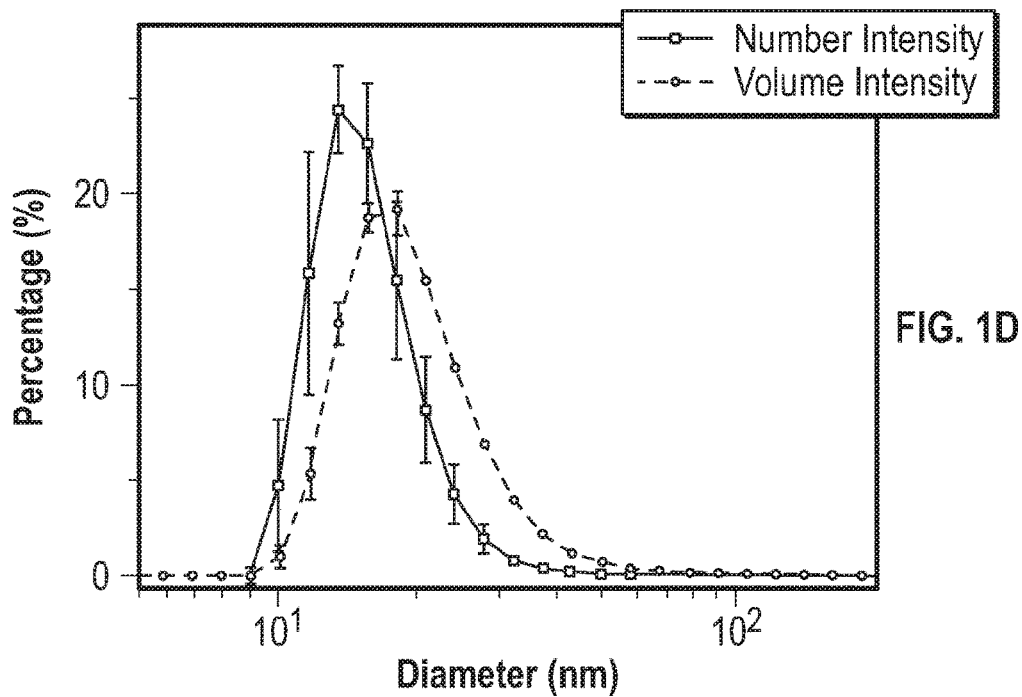
FIG. 1D is a plot of the number-averaged and volume-averaged particle size distribution as obtained by dynamic light scattering in 1,2-porpanediol/methanol for the particles in FIG. 1A, in accordance with various embodiments.

In various embodiments, the $TiO_2$ nanoparticle core size is below 10 nm, confirmed by TEM image (FIG. 1A). Dynamic light scattering (DLS) measurement (Malvern Nano Zetasizer) shows particle size distribution in solution (FIG. 1D). The number- and volume-averaged particle size were 13.6 and 15.7 nm, respectively. The size difference between DLS and TEM results from both minor aggregation and the inclusion of ligand size in the DLS. The 20 wt % dispersion was diluted with 1,2-propanediol and methanol in 1:1:5 weight ratio to obtain an approximately 3 wt % $TiO_2$ nanoparticle ink. In various embodiments, the ink comprises 0.5, 1, 1.5, 2, 2.5, 3.5, 4, 4.5, or 5 wt % of $TiO_2$ nanoparticles. Larger aggregates were filtered before use with a 0.45 μm PTFE syringe filter. These steps ensure that the ink is homogeneous and has low viscosity, which is favorable for mass transfer. As shown in FIG. 1C, the $TiO_2$ formed a stable dispersion in this mixture of solvents, with negligible precipitation observed over several months. FIG. 1C also shows that the ink exhibits a very low viscosity of 1.8 mPa·s which is close to the viscosity of the mixture solvent (1.37 mPa·s at 25° C.). The calculated d-spacing of the (101) planes is 0.36 nm as confirmed by high-resolution TEM imaging (FIG. 1B).

Figure 2:
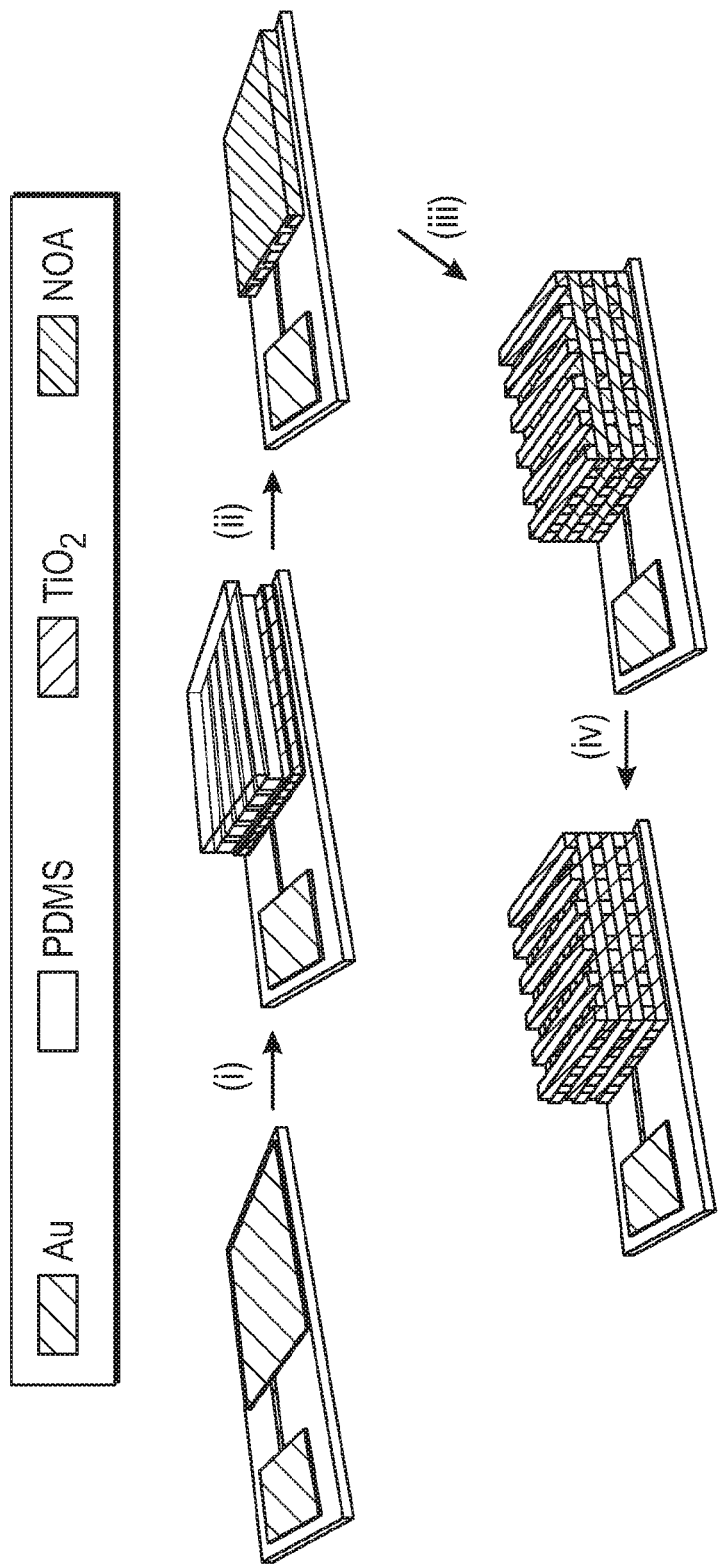
FIG. 2 is a schematic illustration of a method of making a woodpile electrode, in accordance with various embodiments.

Example 3. Fabrication of Patterned and Multilayered Structure with Imprint Lithography An exemplary scheme for manufacturing a woodpile (multilayered) electrode is depicted in FIG. 2. In FIG. 2, a gold charge collector, made by depositing a bilayer of Ti/Au (5 nm/50 nm) with a defined area (1.5×1.5 cm$^2$) was evaporated onto a silicon dioxide wafer, serving as the current collector, is subjected to (i) single layer imprinting, $TiO_2$ ink spin coated on the gold charge collector followed by the PDMS stamp molding-drying-demolding process, then (ii) planarization with cross-linkable thiol-ene based acrylate resin, then (iii) multilayer structure fabrication by repeating (i) and (ii), then calcination (iv) (annealing) to obtain the woodpile electrode.

In various embodiments, to make the woodpile architecture, silicon dioxide wafer substrates were sonicated in ethanol and acetone for 5 min and immersed into piranha solution (mixture of sulfuric acid and hydrogen peroxide (30%) at 3:1 in volume) for 2 h. Then, these substrates were washed with deionized (DI) water, and dried under nitrogen gas. The $TiO_2$ nanoparticle ink was spin-coated on the silicon dioxide wafer substrate at 3000 rpm for 90 s in a glove box with a 5% relative humidity environment. Then, the PDMS stamp was placed on the ink and dried on a hot plate at 55° C. for 10 min. After drying, the PDMS stamp was peeled off and a patterned film was obtained.

In various embodiments, a UV-crosslinkable, low viscosity organic thiol-ene acrylate prepolymer (NOA60, Norland Products Inc.) was used for planarization. After imprinting the first layer, the patterned structure was first pretreated with UV-ozone for 15 min. Then two layers of NOA60 were deposited by consecutively spin coating and curing. The imprinting-planarization process was simply repeated for the desired number of layers. Finally, $TiO_2$ with the designed desired height was calcined (annealed) at 750° C. for 5 min. Structure dimensions were checked under SEM (Magellan 400).

Example 4. Fabrication of the Woodpile Architecture

FIG. 2 depicts the fabrication process of the multilayered $TiO_2$ electrode via solvent-assisted soft NIL. First, a bilayer of Ti/Au (5 nm/50 nm) with a defined area (1.5×1.5 cm$^2$) was evaporated onto a silicon dioxide wafer, serving as the current collector. The current collector and contact pad were connected by a thin trace of gold, the dimensions of which are negligible relative to the current collection area. In this way, all device footprint areas are the same. The imprinting follows a typical spin coating-molding-demolding process. Poly (dimethyl siloxane) molds have been proven to be solvent permeable; this helps solidify the patterned structure, rendering it mechanically stable during the demolding process.

In various embodiments, in order to make multilayered structures, planarization is necessary to enable imprinting of the next layer. A UV-crosslinkable thiol-ene based photoresist (NOA 60, Norland Products Inc.) can be used as the planarization material. During spin-coating, the photoresist fills the patterned trenches, forming a solid, planar surface after UV exposure. This planarized surface then acts as the new substrate. By repeating steps of planarization and imprinting, additional layers can be readily stacked onto previous ones.

Figure 3A:
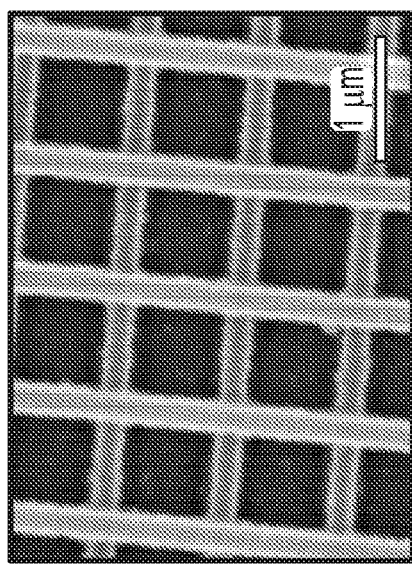
FIG. 3A is an SEM (scanning electron microscope) image of the top view of a single layer imprint, in accordance with various embodiments.
Figure 3B:
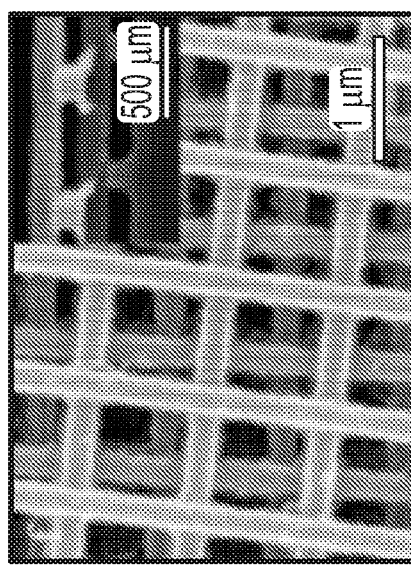
FIG. 3B is an AFM (atomic force microscope) height profile of a single layer imprint, in accordance with various embodiments.
Figure 3C:
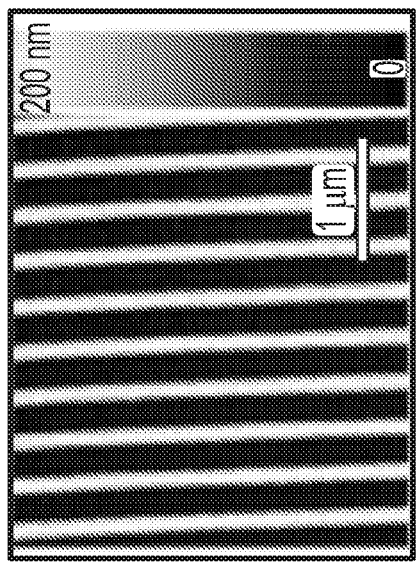
FIG. 3C is an SEM image of a top view of a 2-layer woodpile structure, in accordance with various embodiments.
Figure 3D:
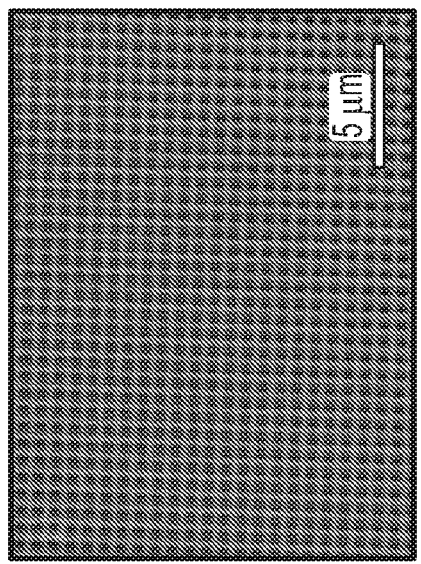
FIG. 3D is an SEM image of a top view of a 3-layer woodpile structure, in accordance with various embodiments.
Figure 3E:
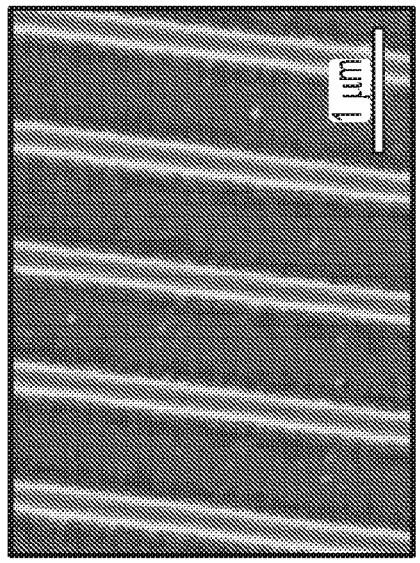
FIG. 3E is a zoomed-out SEM image of a 3-layer woodpile structure, in accordance with various embodiments.
Figure 7:
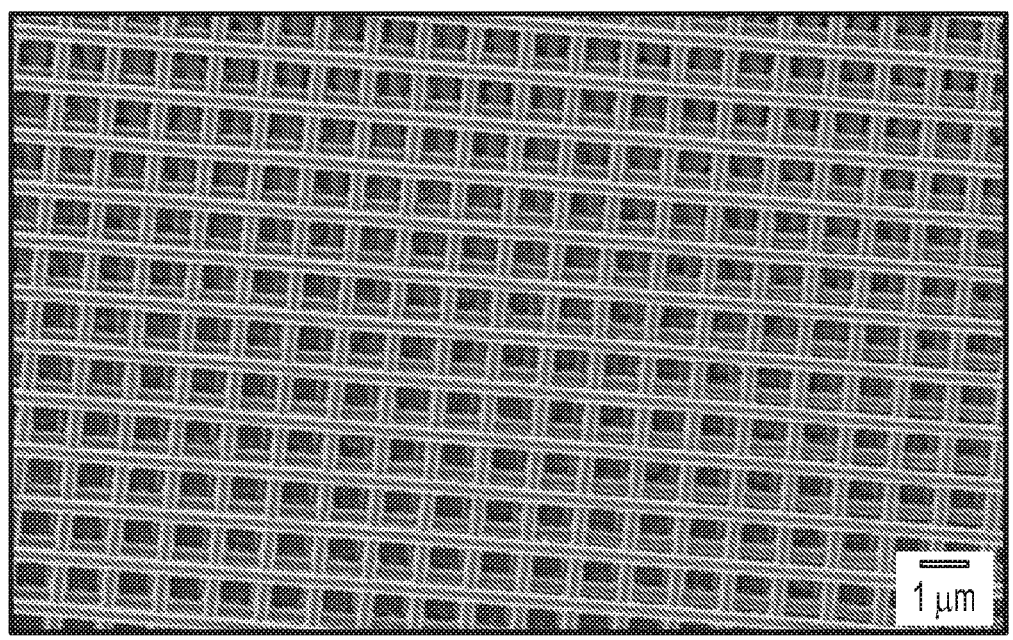
FIG. 7 is a SEM micrograph showing a larger area of an imprinted 4-layer woodpile structure, in accordance with various embodiments.

Scanning electron microscopy (SEM) and atomic force microscopy (AFM) of the attained single layer imprint show that well-defined line pattern of approximately 200 nm in width and height (FIG. 3A, 3B) is obtained, generating an aspect ratio of 1. Barely any residual layer was observed. The deviation from stamp dimension results from the shrinkage caused by solvent evaporation and calcination. The dimensions remained consistent in the multilayered woodpile structure (FIG. 3C-3F). The $TiO_2$ lines of two consecutive layers were oriented perpendicularly to minimize the overlap area (FIGS. 3C, 3D, 3E). In this way, as the structure volume increases with the number of stacked layers and a constant surface-to-volume ratio is maintained, which is favorable to the rate performance. FIG. 7 shows another SEM view of a 4-layer woodpile architecture.

After the stack-up procedure, the imprinted electrode with a designated height was calcined at 750° C. for 5 min before electrochemical tests. During calcination, the NOA 60 photoresist and organic ligands used to stabilize $TiO_2$ nanoparticles were removed as verified by the thermal gravimetric analysis. The removal of ligands resulted in nano-scale voids within the $TiO_2$ lines and yielding a porosity of approximately 31.3%. The porosity was calculated by the Lorentz-Lorentz equation based on the refractive index of calcined $TiO_2$ film. Neck formation between particles helped to enhance the mechanical strength of the final structure.

According to the Lorentz-Lorentz relation, $f_v = C - A/B - A$, where, $A = n_A^2 - 1/n_A^2 + 2$, $B = n_B^2 - 1/n_B^2 + 2$, and $C = n_C^2 - 1/n_C^2 + 2$. In the previous equations, $f_v$ is the void volume fraction, A uses the index values for the pure material (anatase $TiO_2$), B for air, and C for the composite film being measured. In the single layer film, $n_A = 2.49$ (assuming all anatase), $n_B = 1.00$, $n_C = 1.82$ (@ 589 nm). And the calculated void air volume fraction is 31.3% v. In the 6-layer film, $n_C = 1.91$ (@ 589 nm). The calculated air volume fraction is 26.0%.

Figure 3F:
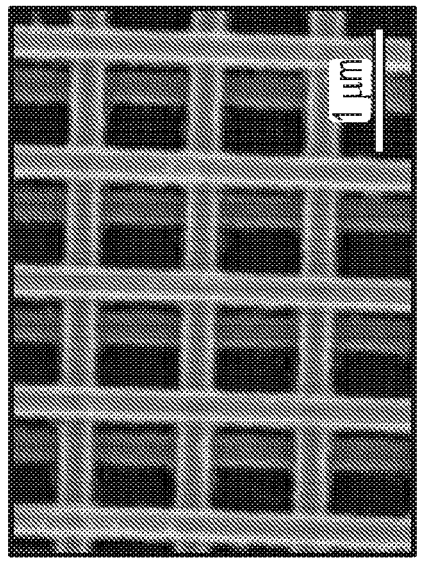
FIG. 3F is an SEM image of a top view of a 4-layer woodpile structure, in accordance with various embodiments.

X-ray diffraction showed that after calcination, a small amount of titanium dioxide converted from anatase to rutile. As both anatase and rutile $TiO_2$ are electrochemically active, and possess close theoretical specific capacity (~330 mAhg$^{-1}$), no extra effort on crystallinity refinement is necessary. Additionally, moderate dimension shrinkage was observed due to the removal of the organic components. The line height decreased from 210 nm to about 180 nm after calcining, and the width was 200 nm for each layer, generating an aspect ratio around 1 (FIG. 3A). Stacking up 2, 3, 4, and 6 (not shown) imprinted layers resulted in features with aspect ratios of 2, 3, and 4, respectively (FIG. 3C, FIG. 3D, and FIG. 3F, respectively). The method was able to achieve defect-free imprinting (FIG. 3E), demonstrating excellent potential for scaled manufacturing.

Example 5. Electrochemical Performance of Woodpile Electrodes

The capacities of woodpile electrodes of different heights were studied by the galvanostatic charge/discharge in a half-cell. Electrodes with 1, 2, 3, 4 and 6 layers were discharged under 1.5 C current (1 C=330 mAg$^{-1}$) and the correlation between capacity and structure height was investigated. Un-patterned TiO$_2$ films of varied thicknesses, with comparable porosity served as references.

All control samples were fabricated by multi-time spin coating and thermal annealing. For example, for a 6-layer reference film, after the first spin coating, the film was thermally annealed at 500° C. for 5 min. This temperature was used to make sure that film was robust enough for the next spin coating while barely any phase transition from anatase to rutile occurs. After the sixth spin coating, the sample was calcined at 750° C. for 5 min, just like the woodpiles. The 6-layer reference film has a thickness of 330 nm, and porosity of 26%. The total mass is comparable to 6 times of the single layer TiO$_2$ film. Each cycle resulted in a 55 nm thick film, confirmed by ellipsometry. The total mass of electroactive material is approximately the same in planar film and in the woodpile structure.

Figure 4A:
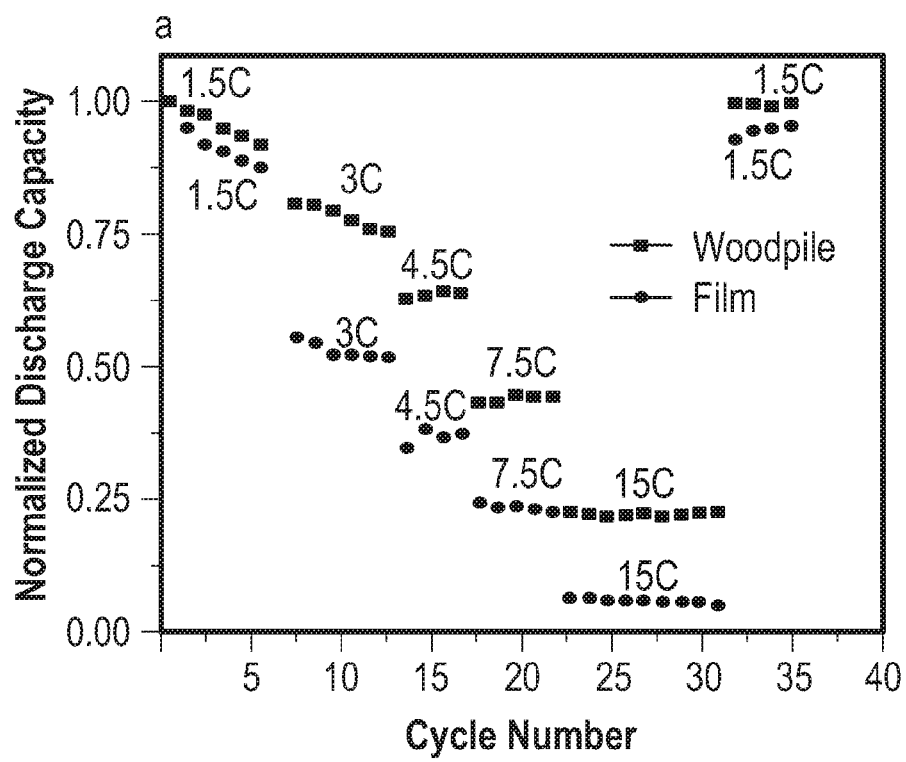
FIG. 4A is a chart of the capacity retention of a 6-layer woodpile electrode and control film sample under discharge rates from 1.5 C (500 mA $g^{-1}$) to 15 C (5000 mA $g^{-1}$), in accordance with various embodiments.
Figure 4B:
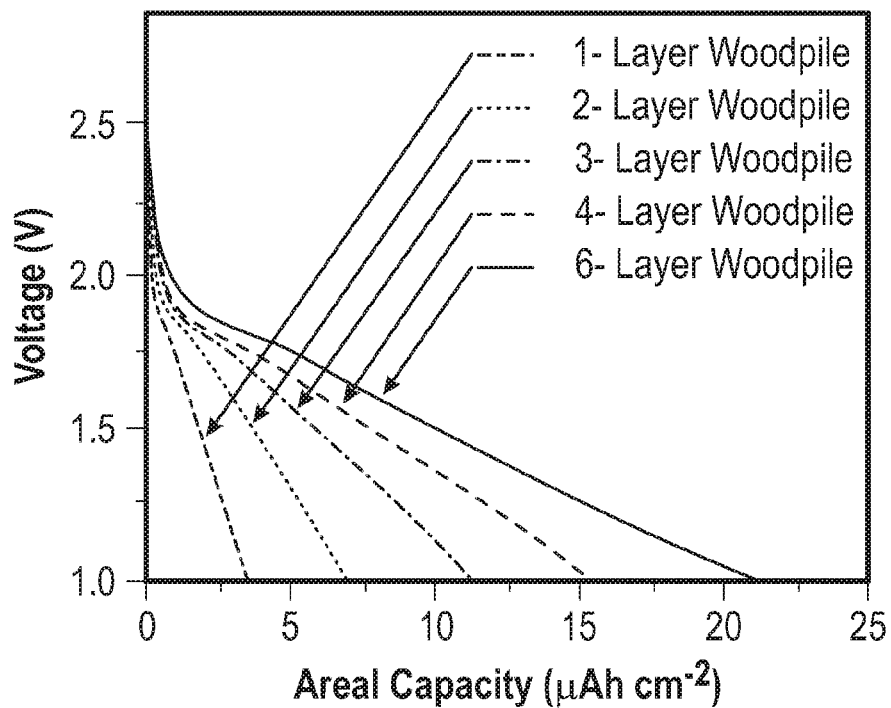
FIG. 4B is a chart of galvanostatic discharge profiles of imprinted architectures with 1, 2, 3, 4, and 6 layers under a current density 500 mA $g^{-1}$, in accordance with various embodiments.

The observed woodpile capacity was almost directly proportional to the number of structure layers (3.6, 7.1, 11.4, 15.5 and 21.3 μAh cm$^{-2}$ for 1-, 2-, 3-, 4- and 6-layer electrodes, respectively) (FIG. 4B). As the woodpile was stacked higher, the total energy stored in the system was effectively multiplied. The specific capacities of woodpile electrodes with one to six layers were almost identical, approximately 250.9 mAhg$^{-1}$ (normalized to the calculated mass of the reference film). This value is close to the theoretical specific capacity of TiO$_2$ (330 mAhg$^{-1}$) and is among the highest reported values, demonstrating that disclosed method of particle packing facilitates the more efficient use of electroactive materials in the system. On the other hand, in the 2D configuration, increasing film thickness failed to achieve a proportional capacity improvement.

To demonstrate sequential imprinting as an efficient way to enhance areal capacity, a series of un-patterned TiO$_2$ film electrodes with comparable loading and porosity were fabricated as control samples. For example, a TiO$_2$ film made by six spin coating-calcination cycles is used to compare with the 6-layer woodpile. The areal capacity of woodpile electrodes increases linearly with the stacking of layers. The imprinted electrodes exhibit areal capacities of 3.6, 7.1, 11.4, 15.5, and 21.3 μAh cm$^{-2}$ for 1-, 2-, 3-, 4-, and 6-layer electrode, respectively, under discharge current density of 500 mA g$^{-1}$. These results establish that the woodpile stacking is effective toward multiplied capacity.

A 6-layer film only generated around quadruple capacity of a single layer, indicating a significant waste of TiO$_2$ due to inefficient material packing. Without being bound by theory, this can be explained in terms of reaction-diffusion kinetics. When the structure dimension is small, the electrochemical process is not likely to be kinetically hindered, shown by the overlap of discharging profiles of the patterned and un-patterned single layers. As the electrode gets thicker, the slow rate of Li-ion diffusion across the electrode becomes significant. As lithium mainly inserts from the top of the film, ion insertion into the bulk TiO$_2$ is impeded and only the top layer is electroactive during cycling.

The woodpile avoids transport limitations within the scaled electrode structure by maintaining a constant surface-to-volume ratio. As liquid electrolyte penetrates the woodpile mesh, lithiation occurs simultaneously throughout the structure. As shown in FIG. 4A, at 3 C (~1000 mA g$^{-1}$), the planar TiO$_2$ electrode lost half of its capacity while the woodpile electrode demonstrated a capacity retention of 75%. From 1000 mA g$^{-1}$ to higher discharge rates, the woodpile electrode consistently exhibited double to triple the capacity retention relative to the planar (film) electrode. Even at rate as high a 15 C (5000 mA g$^{-1}$), the woodpile electrode is able to deliver 25% of its initial capacity whereas the flat sample suffers almost complete capacity degradation.

Figure 8B:
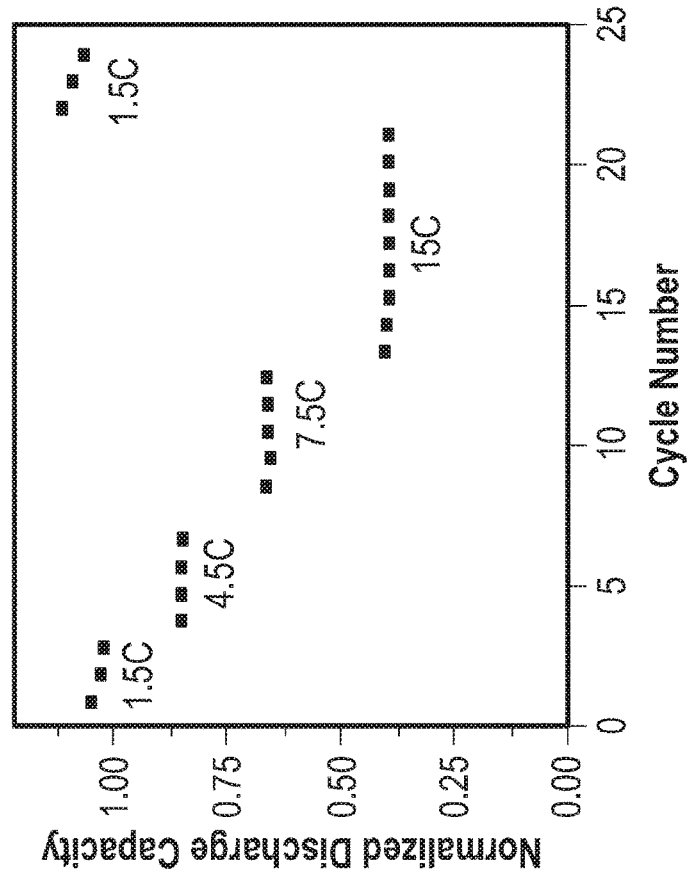
FIG. 8B is a graph of capacity retention of a 6-layer woodpile electrode under discharge rates from 500 to 5000 mA $g^{-1}$ in an extended voltage window from 0.4-3.0 V versus $Li^+/L$, in accordance with various embodiments.
Figure 8A:
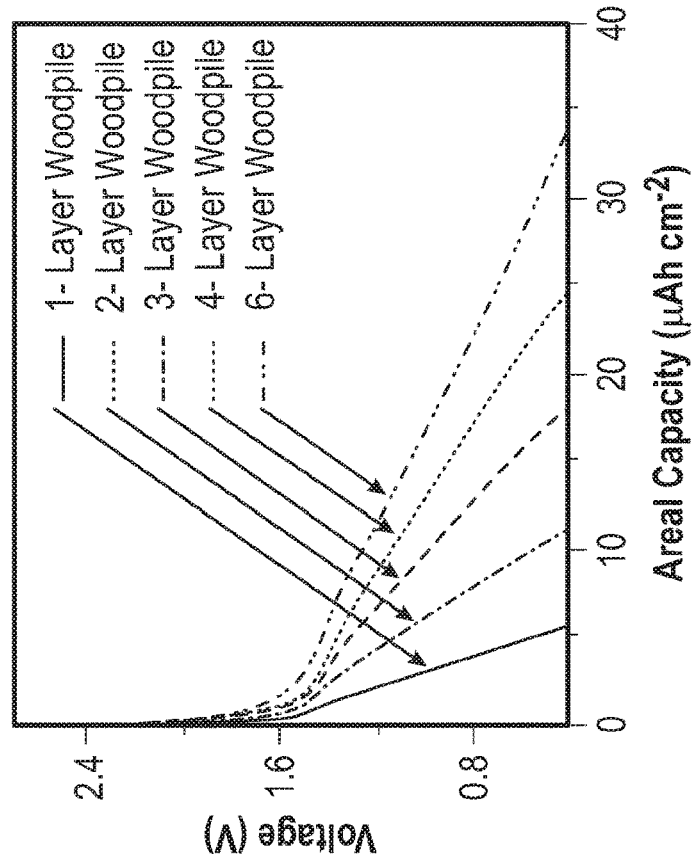
FIG. 8A is a graph of expanded areal capacities of 1-layer to 6-layer structures in an extended voltage window from 0.4-3.0 V versus $Li^+/L$, in accordance with various embodiments.

From 3 C to higher C-rates, the 6-layer woodpile had a two to fourfold increase regarding the depth-of-discharge (DOD) compared to the reference film (discharge current density of 1 C is 335 mA g$^{-1}$) (FIG. 4B). The woodpile maintained approximately 80% and 50% of its 1 C capacity at 3 C (510 mAg$^{-1}$) and 7.5 C (2500 mAg$^{-1}$), while the planar configuration only achieved half of the value (~50% and 25%). Notably, under rate as high as 15 C (5000 mAg$^{-1}$), the reference film suffered almost complete capacity degradation, whereas the woodpile displayed a capacity retention of around 25%. This resulted in a significant improvement (by a factor of 6) between the specific capacity values of the woodpile and planar film. As shown in FIG. 8A, the woodpile electrodes still followed linear relationship as stacking of layers increased and demonstrated expanded capacity values in the extended voltage window of charge/discharge.

This indicates that the structure is mechanically stable during repeated lithiation-delithiation cycles. To further investigate the stability of the imprinted electrode, we extended the lower cutoff voltage to 0.4 V. The woodpile electrodes followed linear relationship as stacking of layers increased and demonstrated expanded capacity values. The areal capacity of 6-layer electrode increased from 21.3 to 35.1 μAh cm$^{-2}$, resulting in specific capacity as high as 413.4 mAh g$^{-1}$, which is even larger than the theoretical value of 335 mAh g$^{-1}$. Without being bound by theory, it is believed that surface charge storage mechanisms may be involved. The randomly oriented small TiO$_2$ crystallites can provide nanovoids to adsorb additional Li$^+$, which is similar to the "house of cards" model used to explain larger Li$^+$ storage capacity in amorphous carbon. Surprisingly, the imprinted TiO$_2$ woodpile electrode could be stably cycled under current densities from 500 to 5000 mA g$^{-1}$ (FIG. 8B).

Both thermal treatment and the intrinsic low volume expansion ratio of TiO$_2$ contribute to the stability. SEM top and cross sectional views confirm that structural integrity was well maintained after the tests. It was noted however, that compared to the untested woodpiles, the structure surface of the tested woodpiles became coarse. It has been reported that a solid electrolyte interface (SEI) tends to form on the electrode during the initial cycles. In fact, the formation of a Li-permeable SEI protects the TiO$_2$ structure, and results in stable capacity and an intact electrode structure over extended use.

Example 6. Electrochemical Tests on $TiO_2$-Based Electrodes

All electrochemical measurements were conducted in plastic cells assembled and sealed in an argon glove box. In various embodiments, a solution of $LiClO_4$ (1M, in EC/DMC=1/1v) was used as the liquid electrolyte. A piece of lithium metal served as both the counter and reference electrode. To quantitatively compare the electrochemical performance of the titanium dioxide woodpiles, the active footprint areas of all structures were strictly controlled to be the same by the current collectors. Charge and discharge profiles of the electrodes were measured by galvanostatic tests (Maccor 4304) under different C rates, within a voltage window of 1.0 to 3.0 V. Upper and lower cut-off voltages were set to be 2.7 V and 1.0 V. Extended cycling tests were performed with voltage window of 0.4-3.0 V. Control samples of un-patterned $TiO_2$ films with varied thickness were tested under same conditions and used for comparison.

Example 7. Formation of LMO and LTO Inks

The LMO particles were synthesized via a hydrothermal synthesis method in stainless steel autoclaves with a 190 mL teflon reaction chamber. The teflon inserts were removed from the autoclaves and placed on magnetic stirrers. A LiOH solution (100 mL, 0.1 M $LiOH \cdot H_2O$ (p.a. Bie&Berntsen A/S)) was added to the insert and $KMnO_4$ (1.217 g, p.a. Merck) was dissolved under mild stirring. When the $KMnO_4$ was completely dissolved, ethanol (1.2 mL) was added to the solution. The magnet was removed from the insert and the insert was sealed in the autoclave and placed in a preheated oven at 180° C. for 5 hours. The autoclaves were cooled naturally overnight. The product was washed and centrifuged three times in water/ethanol mixtures and dried naturally.

The LTO particles were synthesized via a hydrothermal flow synthesis method. A 4:5 Li:Ti precursor with 5% Li excess was made by dissolving Li metal (0.745 g) in absolute ethanol and mixing it with titanium (IV) isopropoxide (37 mL, 97%, Sigma-Aldrich). The mixture was then diluted with isopropanol (300 mL), and this final mixture was used as the precursor solution. The precursor solvent was then passed through a hydrothermal flow reactor with deionized water as preheated solvent and a reactor temperature of 425° C. (see T. Ohzuku, A. Ueda, N. Yamamoto, *J. Electrochem. Soc.* 1995, 142, 1431). The product was collected and washed in the same way as the LMO particles.

In various embodiments, LMO ink is made by first dispersing LMO and 4-hydroxybenzoic acid (5/1 by weight) in a mixed solvent of N-methyl-2-pyrrolidone and methanol (1/1 wt). The mixture is then bath sonicated for half an hour followed with probe ultrasonication overnight, resulting in a fine, oil-like black ink. Ink concentration is further doubled (around 10% wt) with nitrogen blowing away the methanol and no precipitation is observed during the concentrating process. The ink was homogeneous and stable with a shelf-life of at least 3 months. In various embodiments, LTO ink was made by dispersing LTO nanopowder together with mesoporous carbon (Sigma-Aldrich, d<500 nm) in solvent (DI water/ethanol/ethylene glycol 16/8/1v). The mixture is then bath sonicated for 30 min, followed by another 1 hour of probe sonication. Aqueous polymer binder polyvinylpyrrolidone (Sigma-Aldrich, Mw~58k) was then added into the dispersion followed with ball milling for additional 1 hour. Ink viscosity was characterized by m-VROC rheometer.

Example 8. Cathode Imprinting and Manufacture

Despite the boost in energy and power densities, 3D battery designs can sometimes have non-uniform current distribution within the electrochemical cell. This may lead to uneven electron and ion concentration in the vicinity of electrodes. Conceivably, e.g. in discharging, the locally Li-ion depleted area at negative electrode will result in premature end of delithiation. A dimensionless number U is proposed (Equation 1) to quantitatively measure uniformity of current, $U=(w/h)^2 (\mu/\sigma)(1/C)$ (Equation 1).

Figure 9:
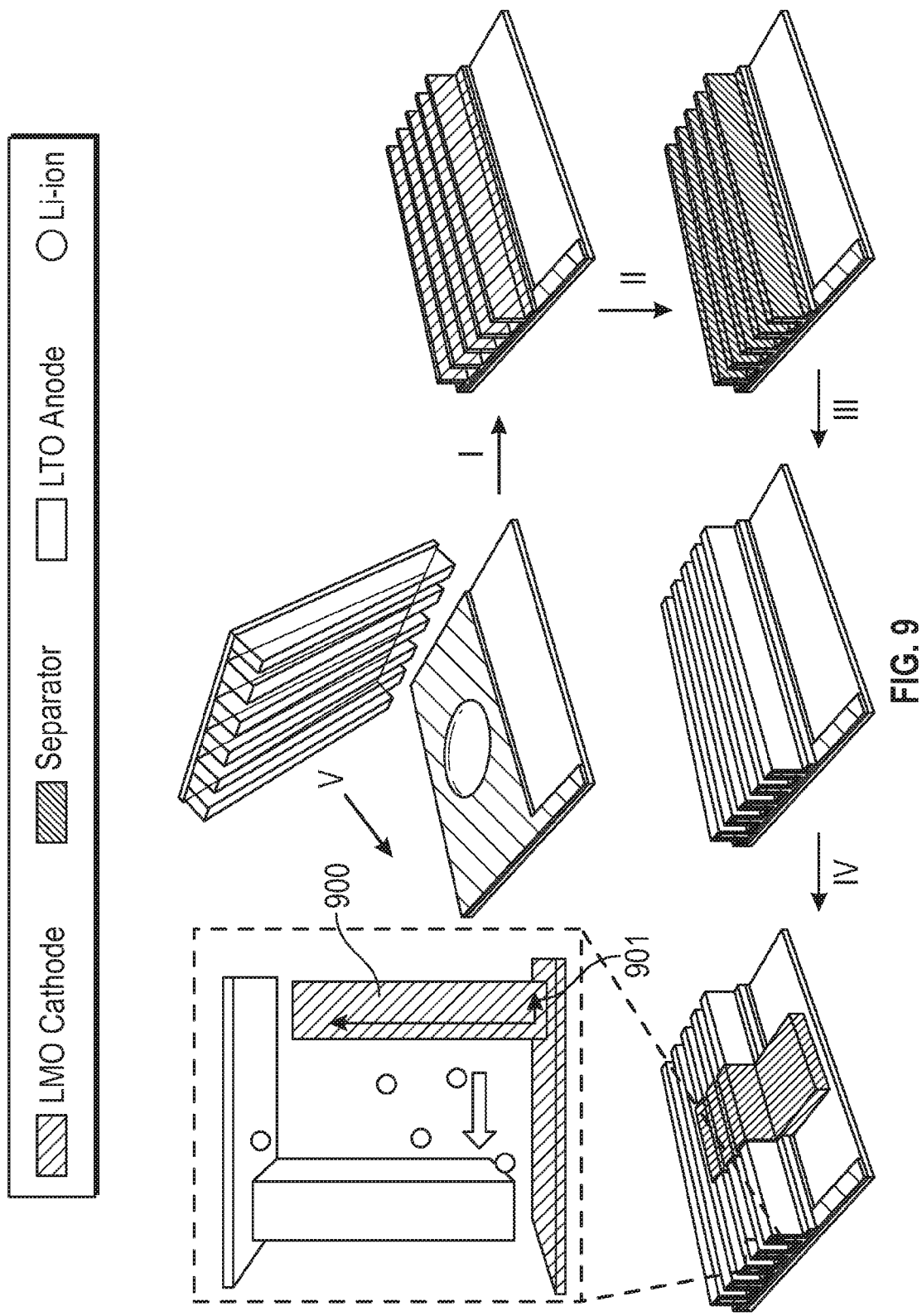
FIG. 9 is a schematic illustration of microbattery fabrication: (i) microcathode array fabrication via solvent-assisted capillary micromolding; (ii) drop coating of PDMA-co-$PEG_{500}$ separator; (iii) coating of LTO/carbon counter electrode; (vi) evaporation of Al charge collector; (v) illustration of 1D transport in a microelectrode array.

In Equation 1, w (901) and h (900) are the width and height of the electrode as depicted in (v) in FIG. 9, respectively. The variables $\mu$ and $\sigma$ are the mobility of $Li^+$ and electronic conductivity of electrode, respectively, and C is the volumetric energy capacity. A small U corresponds to uniform current distribution. By using higher aspect ratio (h/w) electrode and increasing its electronic conductivity, a more uniform current distribution in a battery can be achieved.

The fabrication strategy, according to various embodiments, is depicted in FIG. 9. To start, LMO microelectrodes are imprinted on an indium tin oxide (ITO) coated glass substrate using solvent-assisted capillary micromolding (i). ITO serves as a cathode charge collector. After thermal annealing in $N_2$ flow, the cathode array is coated layer-by-layer with drop casted PDMA-co-$PEG_{500}$ as separator/GPE (ii), and with a LTO/mesoporous carbon composite as counter electrode (iii). Finally, a thin layer of Al was thermally evaporated on top as anode charge collector (vi). The device active footprint is defined by the overlapping area of the two charge collectors and is 20 $mm^2$.

In various embodiments, a silicon or silicon dioxide master mold with a line pattern was used. Three different patterns were used (w=width, h=height, p=pitch): 0.5 μm (w)-0.5 μm (h)-1.0 μm (p) (pattern A), 2 μm (w)-3 μm (h)-4 μm (p) (pattern B) and 2 μm (w)-5 μm (h)-10 μm (p) (pattern C) respectively. PDMS stamps are made based on standard Sylgard 184 (Dow Corning) and crosslinker for pattern transfer. During the imprinting process, ITO coated glass substrates were treated with 15 min UV-ozone. In various embodiments, LMO ink was spin-coated onto the substrate at 500 rpm for 1-2 mins, followed with PDMS stamp molding. Drawn by capillary force, the ink rapidly filled the microchannels in the stamp. The sample was then soft baked at 50° C. overnight to remove the majority of solvent.

As solvent gradually permeated through PDMS during the soft bake, the LMO microelectrode structure solidified for easy demolding. After demolding, the samples are further annealed at elevated temperature (~400° C.) for 2 hours in nitrogen flow in a tube furnace. The final dimensions of pattern A, B and C are 0.42 μm (w)-0.39 μm (h)-0.97 (p), 1.1 μm (w)-1.9 μm (h)-3.9 μm (p) and 0.8 μm (w)-3.1 μm (h)-9.6 μm (p) respectively. The structure dimensions are generally smaller than their PDMS master molds due to volume shrinkage from solvent evaporation and thermal annealing. The resultant aspect ratios of the imprinted A, B and C pattern were 0.9, 1.7 and 3.8. Based on the relation ($U \propto (h/w)^{-2}$), pattern C was expected to provide the most uniform current distribution among the three patterns described above.

In various embodiments, to fabricate the cathode, LMO nanoparticles were stabilized by 4-hydroxybenzoic acid (HBA) in N-methyl-2-pyrrolidone (NMP). Proton exchange between HBA and —OH groups on nanoparticle surface is believed to enable the ink to be stable for months. The as-synthesized LMO and LTO nanoparticle are both hydrophilic due to the abundance of surface —OH groups. The 3D electrode fabrication followed the procedures described herein. The cathode was imprinted on an indium tin oxide (ITO) coated glass slide, serving as the cathode current collector. As the targeted aspect ratio exceeded 2.5, it is necessary that the ink could be effectively transported and fully filled the stamp trenches. In various embodiments, the ink had a solid concentration of 10% wt and possessed good fluidity, with a viscosity of between about of 1.8-3.2 mPa s (compared to 1.6 mPa s for the NMP solvent) which owed to the readiness of nano-size particles stabilization and the resultant homogeneous dispersion. The electrode structure was thermally annealed at 400° C. nitrogen flow.

During this process, the organic ligands degraded and remained as carbon residue, serving as conductive filler to lower the electrode impedance and helping to improve the rate performance. Connectivity between LMO nanoparticles were strengthened and a robust electrode structure was readily attained. Due to volume shrinkage, the dimensions of electrode fingers, in various embodiments, were slightly smaller than patterns on silicon master mold. The final line feature's height, width and pitch were 1.5 µm, 4.0 µm and 10.0 respectively, with an aspect ratio as high as 2.7. A very thin layer polymer separator was spin coated onto the electrode from a propylene glycol methyl ether acetate (PGMEA) solution.

Figure 6A:
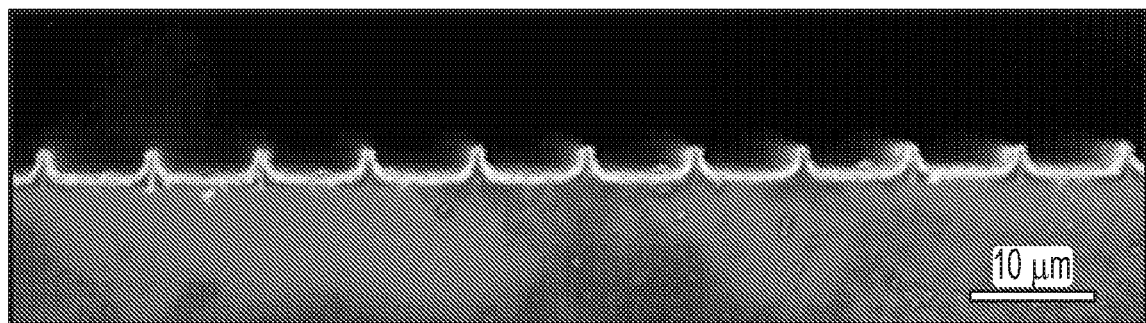
FIG. 6A is a cross-sectional SEM image of fully assembled microbattery, in accordance with various embodiments.
Figure 6B:
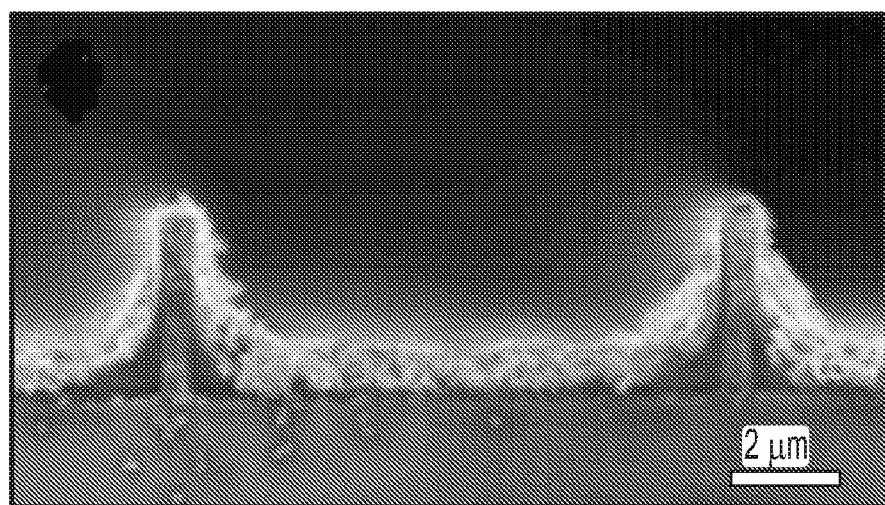
FIG. 6B is a zoom-in SEM image of integrated microbattery architecture, in accordance with various embodiments.

In various embodiments, the polymer was a commercially available resin, containing the UV-curable "slide-ring" elastomer and reactive acrylates. The electrode was treated with UV-ozone beforehand to improve separator adhesion. Optical profilometry showed the electrode topography was well maintained after separator coating. The microbattery integration was completed with the final step of anode filling. The anode ink was aqueous-based with small amount of ethylene glycol and ethanol to improve particle dispersion and film forming. Since the "slide-ring" resin was cross-linked and insoluble, the separator layer was not affected during the anode coating. The anode ink solid part was composed of 33% active materials, 33% carbon black fillers and 33% aqueous binder by volume, such that the resultant electrode could have reasonably low impedance and desirable robustness without thermal treatment. The capacity was also tuned to match with the cathode capacity. The SEM cross-section view was shown in FIGS. 6A and 6B. Interdigitated electrodes were closely assembled together, separated by slide-ring resin of hundred-nanometer thickness. This 3D topography largely increased the surface area of electrodes.

Figure 10A:
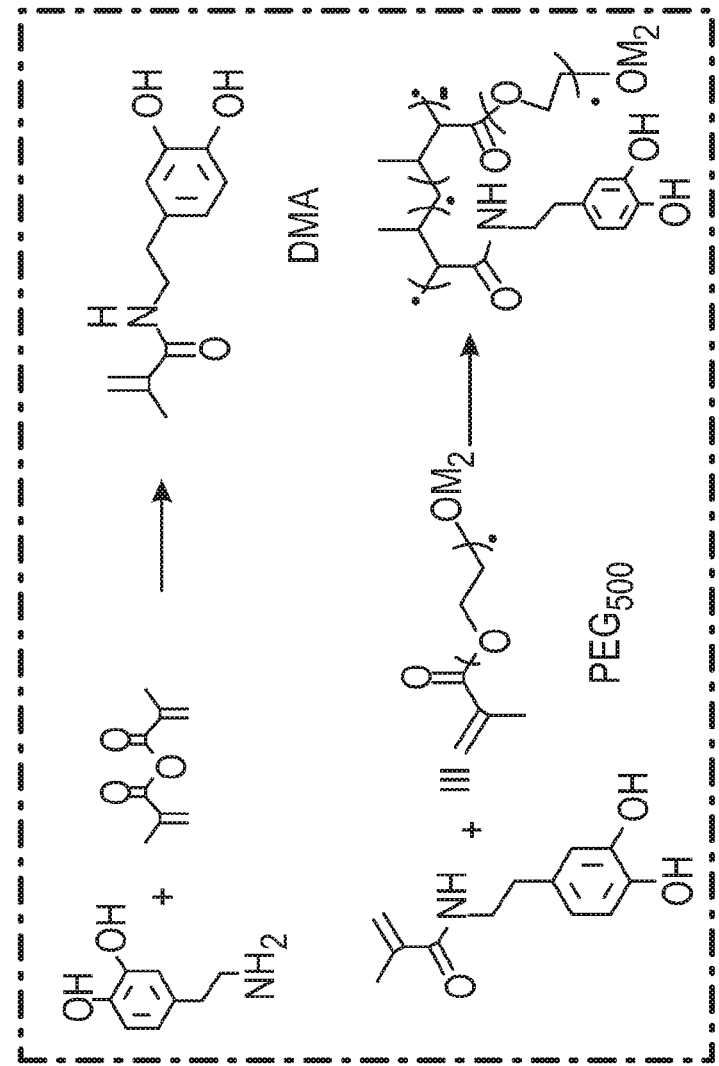
FIG. 10A is a synthetic scheme for the synthesis of a PDMA-co-$PEG_{500}$ copolymer, in accordance with various embodiments.
Figure 10B:
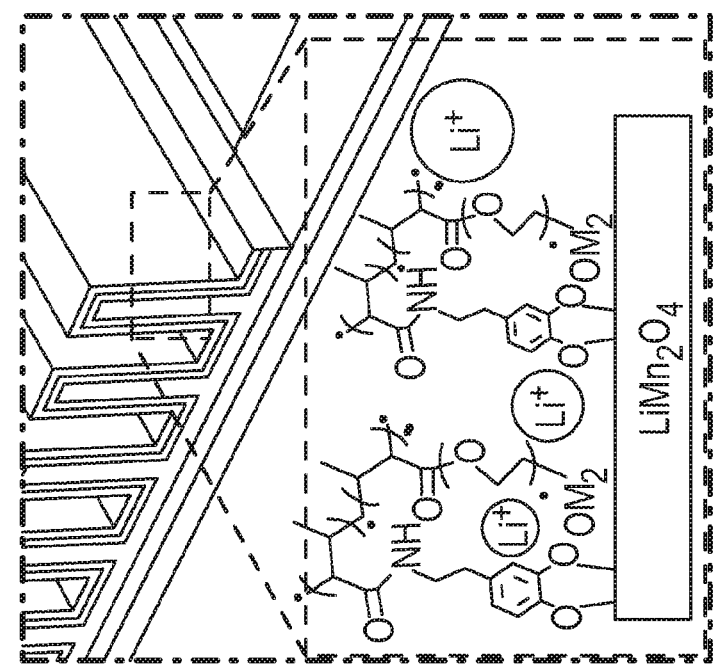
FIG. 10B is a schematic illustration of catechol binding in PDMA-co-$PEG_{500}$ with a metal oxide surface, in accordance with various embodiments.

PDMA-co-PEG$_{500}$ was synthesized according to the scheme shown in FIG. 10A. Dopamine acrylamide (DMA) was synthesized and purified by following a reported method (H. Lee, B. P. Lee, P. B. Messersmith, *Nature* 2007, 448, 338). To synthesize PDMA-co-PEG$_{500}$, poly (ethylene glycol) methyl ether methacrylate (PEG$_{500}$, M$_w$=500 g mol$^{-1}$, Sigma-Aldrich) was passed through a basic Al$_2$O$_3$ column to remove the inhibitor. DMA (1.1 g), PEG$_{500}$ (5.0 g) and azobisisobutyronitrile (AIBN, 0.11 g) were dissolved in DMF (15 mL) in a 50 mL Schlenk flask. The system was degassed through three freeze-pump-thaw cycles and stirred overnight at 60° C. The polymer was precipitated in ethyl ether three times and was dried in oven. The molecular weight was measured by MALS-GPC. The molar ratio of comonomers in PDMA-co-PEG$_{500}$ was characterized by $^1$H NMR with deuterated water. The degree of crystallization was measured by DSC between –60° C. and 110° C. with a scanning rate of 5° C./min.

Example 9. Microbattery Integration and Packaging

Figure 5:
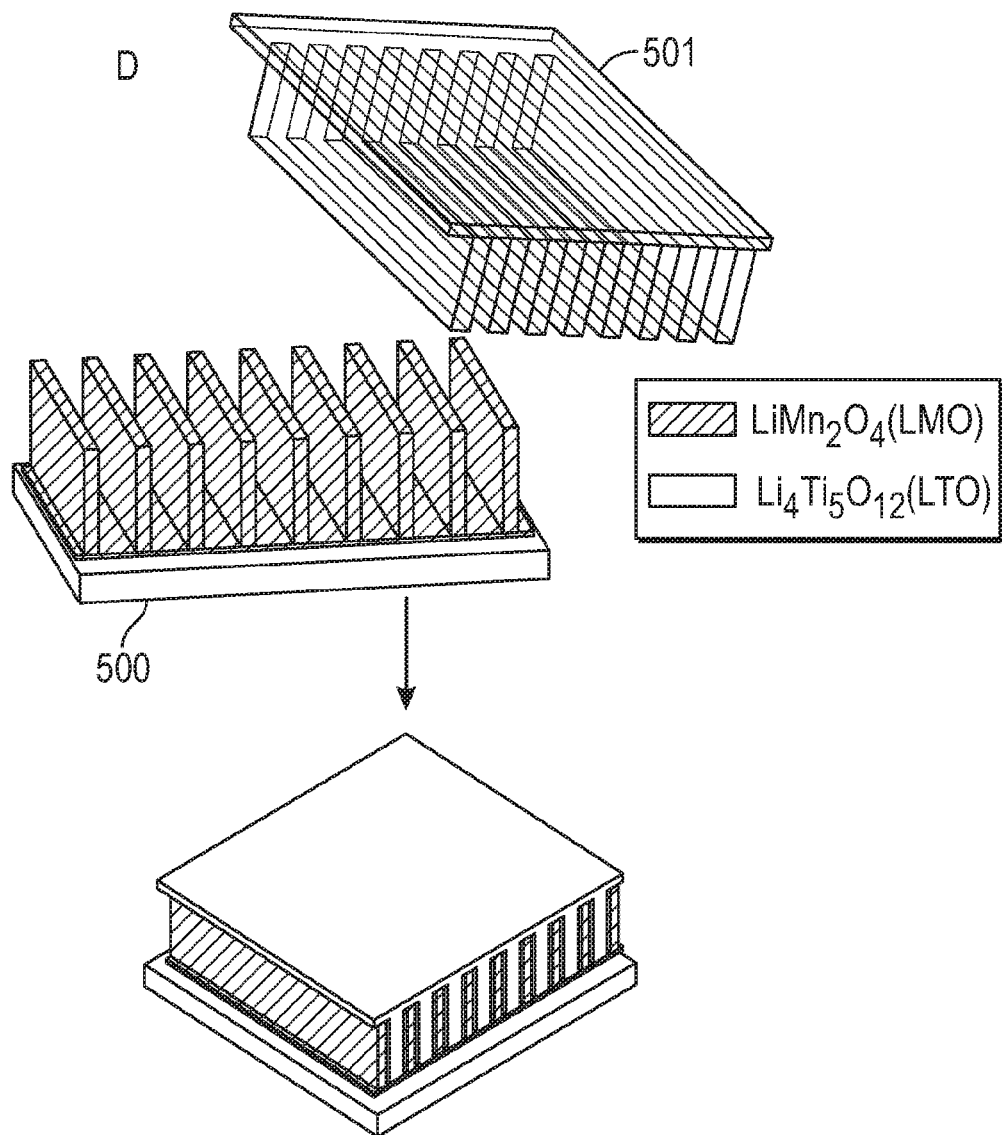
FIG. 5 is a schematic illustration of an imprinted 3D battery fabrication sequence, in accordance with various embodiments.

Before integration, the electrochemical performance of the imprinted microelectrode (1 cm$^2$ footprint) was checked in a half-cell test, wherein lithium metal served as the counter/reference electrode. A cyclic voltammogram (CV) of a LMO microelectrode under scan rates from 0.5 mVs$^{-1}$ to 5 mVs$^{-1}$ was obtained. At 0.5 mVs$^{-1}$, two distinct cathodic peaks at 4.13 and 4.0 V are observed, which agrees well with the two-step insertion of Li$^+$ into the LiMn$_2$O$_4$ matrix. Accordingly, anodic peaks at 4.02 V and 4.15 V correspond to the stepwise Li$^+$ extraction. The well-defined peak splitting can be attributed to the good crystallinity of LMO nanoparticles. It is noted that the potential difference between anodic and cathodic peak positions is small and only minor shifts are observed as scan rate increases. Both indicate good reversibility at the imprinted cathode. FIG. 5 is a schematic illustration of the imprinted 3D battery fabrication with an ITO coated glass (500) having an LMO electrodes array formed upon PDMS mold (501) liftoff and the final interdigitated battery architecture by sequentially coating polymer separator and backfilling with LTO ink.

Stacked microbattery architecture need careful selection of an appropriate separator and coating strategy. It is important that the separator forms a robust and full coverage layer on the cathode array to ensure stable operation without shorting. In addition, it should facilitate rapid ion transport to achieve high-power performance. PDMA-co-PEG$_{500}$ copolymer was synthesized as the separator and subsequently the matrix for GPE (graphite pencil electrode) after complexation with LiClO$_4$ (EC/DMC) (EC=ethylene carbonate, DMC=dimethyl carbonate) liquid electrolyte. The design of this copolymer is based on the considerations of both coating properties and ionic conductivity.

Figure 11A:
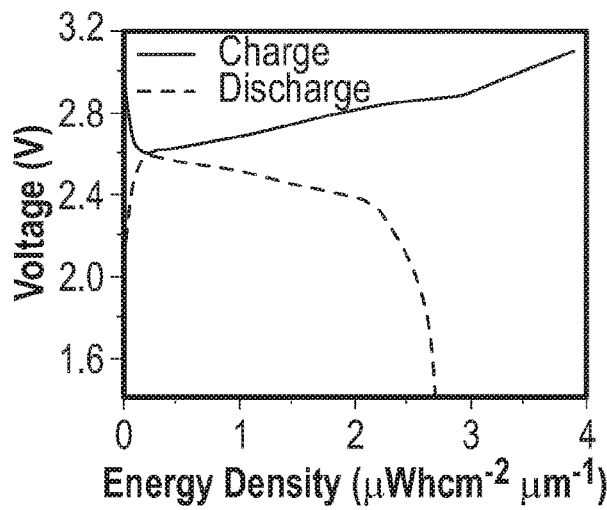
FIG. 11A is a charging/discharging profile of a microbattery at 5 C, in accordance with various embodiments.
Figure 11B:
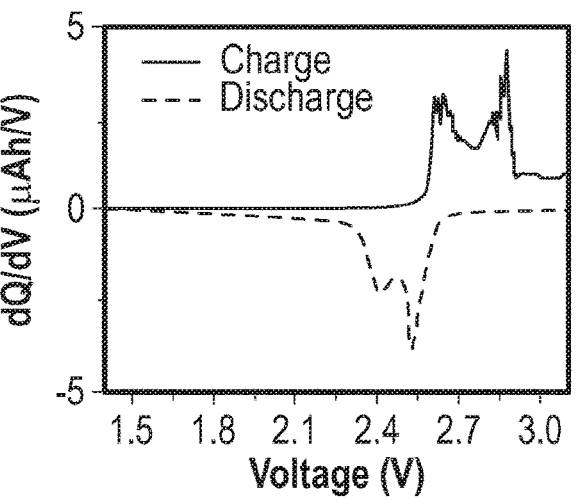
FIG. 11B is a plot of differential capacity curves of microbattery charging and discharging, in accordance with various embodiments.

The incorporation of dopamine methyl acrylamide provides superior adhesion of polydopamine to versatile surfaces. Specifically, the strong interaction between catechol and metal oxide surfaces enables intimate contact of separator and cathode as depicted in FIG. 11B. To coat polymer onto LMO microelectrodes, PDMA-co-PEG$_{500}$ was dissolved in ethanol and the deposition was done by simple drop cast. As ethanol evaporated by mild heating (60° C.), the copolymer covered the LMO microelectrodes on both the top surface and the vertical side wall. Moreover, the electrode's aspect ratio was well maintained.

The battery was fully integrated using a LTO/mesoporous carbon suspension spin coated on top of the separator structure as counter electrode. The final height of the microbattery is approximately 3.5 µm and the cell volume is approximately 0.07 mm$^3$. This includes the volume of electrode plates and the space in between. Notably, no surface treatments, e.g. oxygen plasma or UV-ozone were needed before LTO coating as PDMA-co-PEG$_{500}$ is hydrophilic in nature. The contact angle with water is 34°, which is comparable to polydopamine. Advantageously, the lack of need for surface treatments is an important feature regarding film integrity, since oxygen plasma is destructive to most polymers and may induce defects in coating.

PDMA-co-PEG$_{500}$ was dissolved in ethanol and formed 20 mg ml$^{-1}$ solutions. Before coating, the imprinted LMO cathodes were subjected to 30 s oxygen plasma treatment. For a 1 cm$^2$ imprint, copolymer solution (25 µL) was drop casted onto the imprinted cathode in a glove box with controlled humidity (<3%). The coated samples were dried at room temperature followed by annealing at 70° C. for 30 min. The LTO ink was then spin coated at 1000 rpm for 1 min to complete the battery architecture. The assembled full cells were dried in vacuum oven at 60° C. for 2 hours to eliminate any protonic solvent. Upper aluminum charge collector (100 nm) was thermally evaporated onto LTO. The battery active footprint is defined by the overlapping area of cathode and anode charge collectors and is regulated to 20 $mm^2$.

Example 10. Bilayer Imprinting of a Microbattery

Figure 12:
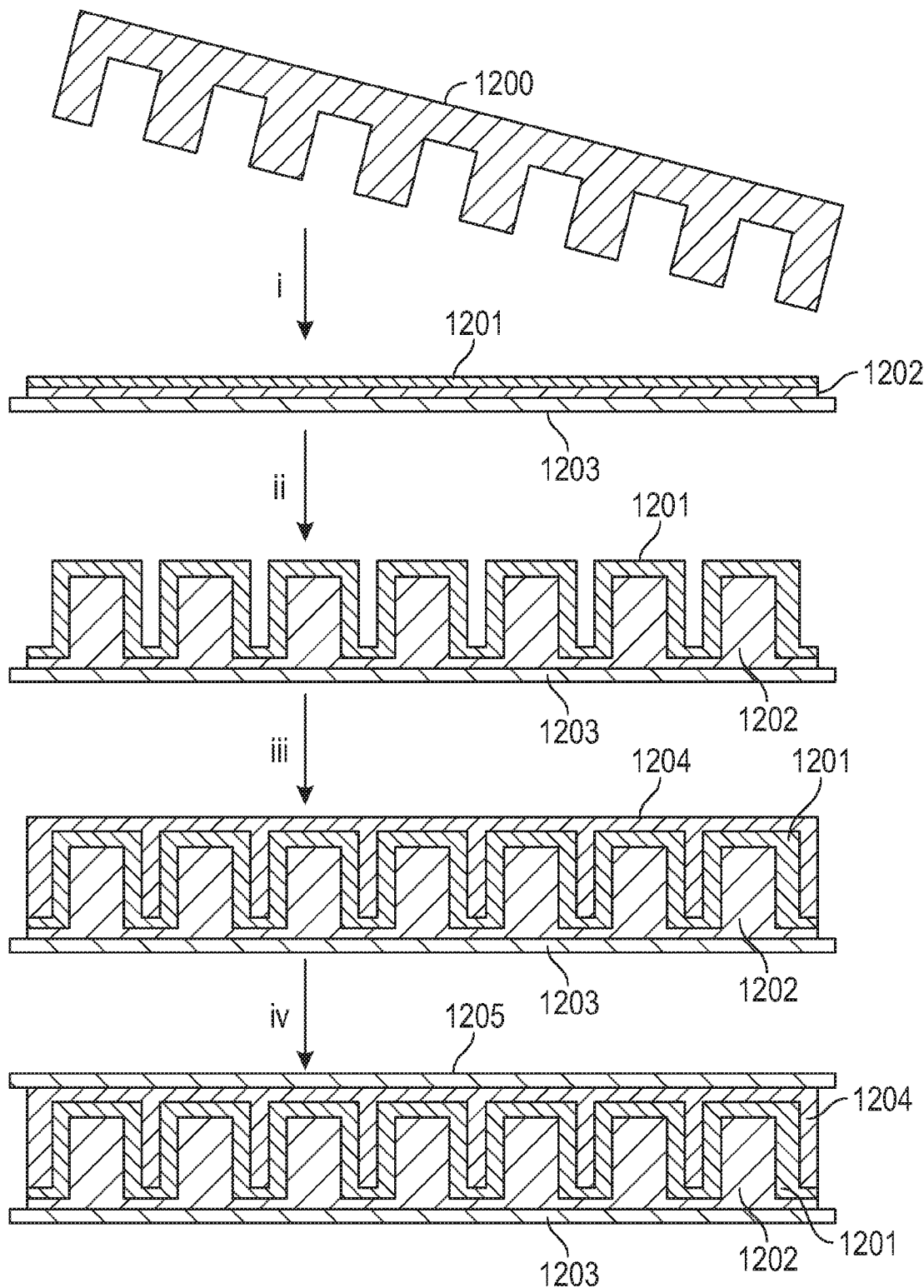
FIG. 12 is a schematic illustration of microbattery fabrication using the bilayer assembly approach, in accordance with various embodiments.

A microbattery with the architecture depicted in FIG. 12 can also be made via a bilayer imprinting method, according to various embodiments. The microbattery has charge collectors 1205 and 1203, anode material 1202, separator material 1201, and cathode material 1204. The charge collectors can be made from or include any suitable conductive material, such as carbon nanopowder. Any of the anode, cathode, and separator materials described herein can be used to construct a battery as depicted in FIG. 12. Although anode ink is used for planarization, the bilayer imprinting method can also be done inversely by imprinting the cathode/separator bilayer first. In various embodiments, any of the batteries or electrode assemblies described herein can be manufactured using bilayer imprinting, for example the LMO/PDMA-co-PEG$_{500}$ microbattery described herein.

In various embodiments, a step (i) involves using the imprint lithography methods described herein to use a mold 1200. The bilayer imprinting method patterns the anode (1202) and separator/electrolyte layers (1201) together using the imprint lithography methods described herein, as show in step (ii) of FIG. 12. This allows the separator layer to cover conformally onto the 3D anode topography without any alignment or using sophisticated coating techniques, e.g vapor deposition/polymerization. Finally, as show in step (iii) of FIG. 12, a dispersion (ink) of cathode material (1204) and at least one conductive additive (e.g. carbon nanopowder) is coated on top of the patterned bilayer, as shown in step (iv) of FIG. 12, to planarize the assembled architecture and the cathode/anode forms an interdigitated electrode array.

For example, a precursor anode ink can be a FeO$_x$/carbon precursor ink. Commercial FeO$_x$ nanoparticle water dispersion (30-100 nm particle size, 20 wt %, Sigma Aldrich) was first solvent exchanged to a DMF (N,N-dimethylformamide) dispersion. To do this, DMF and the original dispersion were mixed in 1:1 ratio by volume. The mixture is then put under nitrogen flow overnight to enable water evaporation. The exchanged dispersion is roughly 20 wt % FeO$_x$ in DMF. In various embodiments, the FeO$_x$ dispersion in DMF is between about 5 and 40 wt % FeO$_x$. Commercial Novolac phenolic resin (acid catalyzed) and Pluronic 127 surfactant are dissolved separately in DMF to reach solid concentration around 100 mg/ml. The FeO$_x$/carbon precursor ink is prepared by simply mixing the three parts together. In various embodiments, the weight ratio of FeO$_x$:phenolic resin: Pluronic 127 is 1:1:1, although any suitable ratio can be used. The mixture is shortly bath sonicated and stir bar mixed for 30 min.

By using a milli-second photothermal treatment, the phenolic carbon precursor can be converted to graphitic carbon through heat and the FeO$_x$ catalytic effects. The photothermal processing is carried out on a Novacentrix Pulse forge 1300 photonic curing system. The light intensity is tuned by changing applied voltage and/or pulse duration time. In various embodiments, the pulse duration time is fixed at 0.6 milliseconds and the voltage at 500 V is applied affording an optimal light energy at 4800 mJ/cm$^2$. This process includes three repeats of a same light pulse with a time interval of one second.

A composite electrolyte ink can be prepared as follows: Aerosil 200, a hydrophilic fumed silica with surface area of 175-225 m$^2$/g and supplied by Evonik Corp., is dispersed in water with high shear, and a 2-8% clear and uniform dispersion is obtained with thixotropic rheology suitable for imprinting.

In various embodiments, to imprint, the FeO$_x$/carbon precursor ink is spin coated on indium/tin oxide (ITO) coated glass. The as-cast precursor film is placed on a 120° C. hot plate for 5 min. Upon heating, the ink solid concentration increases as solvent evaporates and slight crosslinking of phenolic resin occurs to increase the mechanical robustness of the film while stilling maintaining reasonable deformation ability for imprinting. After that, composite electrolyte is cast onto the annealed film. The bilayer film is heated for on plate for another 5 min to concentrate the upper layer. Finally, the film is transferred into the Nanonex imprinting system and a high modulus mold (h-PDMS (h-polydimethylsiloxane) or PTFE (polytetrafluoroethylene)) is placed onto the bilayer film. The imprinting is held at 120° C. for 5 min under pressure followed by demolding.

Example 11: Electrochemical Characterization of LMO/LTO-Based Electrodes

A solution of LiClO$_4$ (1M, in EC/DMC=1/1v) is used as the liquid electrolyte. All the half cell and full cell tests are conducted in an argon filled atmosphere. Cyclic voltammetry tests are performed using the commercial CHI660E Electrochemical System. A scan rate of 0.5 mV/s was used. Galvanic tests conducted on Maccor 440 are made to study the device charge/discharge capability. To investigate the battery performance, a 100 nm-thick aluminum current collector was thermally evaporated onto the anode, during which the deposition area was accurately controlled by a shadow mask and the resultant device footprint area was set to be 20 mm$^2$.

Electrochemical performances of integrated microbattery were characterized galvanostatically between 3.0-1.4 V. A drop of fresh liquid electrolyte was added on top of the battery in an argon-filled glovebox and the microbattery was sealed in a plastic container. Two copper clips were connected to ITO and Al charge collector. Voltage profiles of a microbattery charged and discharged at 5C current are shown in FIG. 11A. The profiles demonstrate distinct plateaus between 2.3 V and 2.9 V, which corresponds well with the electrochemistry based on LMO/LTO redox pair. A two-stage process can be observed in both charging and discharging. The process is clearly shown from the differential capacity curves (FIG. 11B). Sharp peaks at 2.64 V, 2.86 V in charging and 2.41 V, 2.53 V in discharging correspond to Li$^+$ insertion/extraction, which is consistent with cyclic voltammetry of the LMO microelectrode. At 5 C, the microbattery possesses a volumetric energy density of 2.7 μMTh cm$^{-2}$ μm$^{-1}$.

Figure 11C:
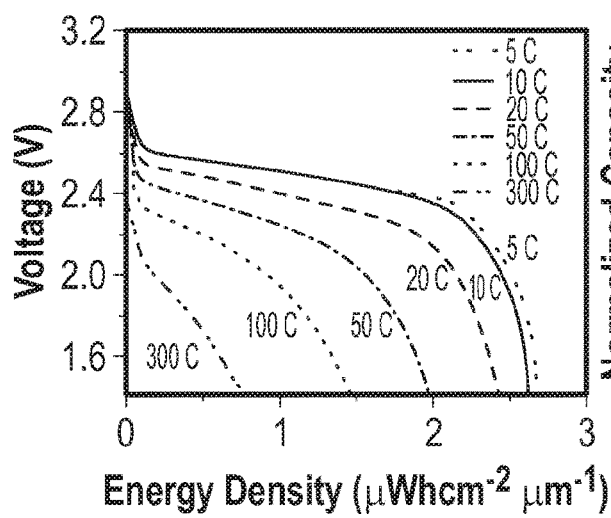
FIG. 11C is a plot of discharge profiles of a microbattery under increasing C rates from 5 C to 300 C, in accordance with various embodiments.

During charging, a larger storage energy density of 3.8 μWh cm$^{-2}$ μm$^{-1}$ was obtained. The Coulombic efficiency of the process started at 80.4% and later stabilized at 88.7%. Without being bound by theory, the efficiency deviation from 100% may result from a minor leaking current. Though separator thickness exceeds the electron tunneling decay length and direct shorting may be avoided, the electrodes may still interact through either "soft contact" as a result of separator dimension change or overlapping of the electrodes' electrical double layers. FIG. 11C shows the voltage profiles of the microbattery charged at 5 C and discharged at different current densities.

Figure 11D:
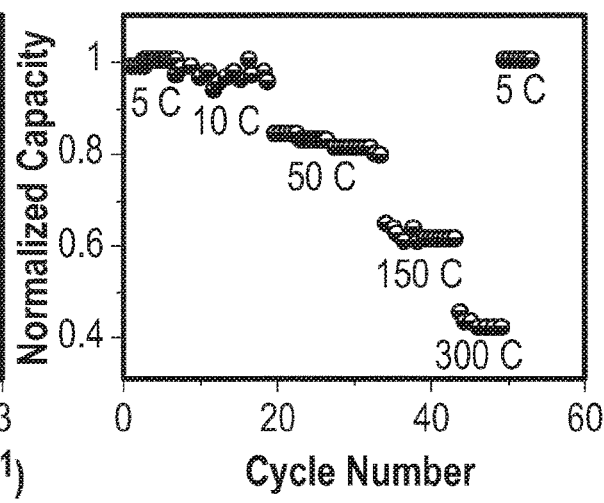
FIG. 11D is a plot of normalized (to 5 C) discharging capacity as a function of cycle number, in accordance with various embodiments.

At 10 C discharging, the microbattery shows little capacity decay, demonstrating an almost overlapped voltage profile and an energy density of 2.6 $\mu$Wh cm$^{-2}$ $\mu$m$^{-1}$. Notably, the voltage profiles from 5 C to 100 C all demonstrate distinct plateaus, indicating good diffusion-reaction kinetics. At 300 C, the battery still retains 28.8% of its 5 C energy (equivalent of 40% capacity retention) and generates a power density as high as 855.5 $\mu$W cm$^{-2}$ $\mu$m$^{-1}$. FIG. 11D presents the normalized discharge capacities at varied C rates as a function of cycle numbers. The microbattery exhibits strong rate capability and almost full capacity retention when going back to lower rate discharging.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

EXEMPLARY EMBODIMENTS

The following exemplary embodiments are provided, the numbering of which is not to be construed as designating levels of importance:

Embodiment 1 provides a method of fabricating an electrode, comprising: depositing an ink comprising electroactive nanoparticles, and optionally at least one conductive additive, on a substrate having an electrical contact to form a film; stamping the film with a mold to form a patterned film; and annealing the patterned film to form an electrode.

Embodiment 2 provides the method of embodiment 1, wherein the substrate is silicon dioxide.

Embodiment 3, provides the method of any one of embodiments 1-2, wherein the electrical contact is gold.

Embodiment 4 provides the method of any one of embodiments 1-3, wherein the depositing comprises spin-coating.

Embodiment 5 provides the method of any one of embodiments 1-4, wherein the spin-coating is performed at about 1000-5000 rpm under inert atmosphere.

Embodiment 6 provides the method of any one of embodiments 1-5, wherein the ink comprises a dispersion of metal oxide nanoparticles.

Embodiment 7 provides the method of any one of embodiments 1-6, wherein the metal oxide nanoparticles have number-averaged and volume-averaged particle sizes of about 1 nm to about 25 nm.

Embodiment 8 provides the method of any one of embodiments 1-7, wherein the metal oxide nanoparticles are crystalline.

Embodiment 9 provides the method of any one of embodiments 1-8, wherein metal oxide nanoparticles comprise about 1-25 wt % of the dispersion.

Embodiment 10 provides the method of any one of embodiments 1-9, wherein the metal oxide nanoparticles are $TiO_2$.

Embodiment 11 provides the method of any one of embodiments 1-10, wherein the dispersion comprises an alcohol solvent.

Embodiment 12 provides the method of any one of embodiments 1-11, wherein the alcohol is methanol, 1,2-propanediol, or mixtures thereof.

Embodiment 13 provides the method of any one of embodiments 1-12, and wherein the patterned film has a parallel grating pattern.

Embodiment 14 provides the method of any one of embodiments 1-13, and, wherein the spacing between the gratings is about 0.05 to about 100 $\mu$m.

Embodiment 15 provides the method of any one of embodiments 1-14, wherein the thickness of each grating is from about 0.01 $\mu$m to about 25 $\mu$m.

Embodiment 16 provides the method of any one of embodiments 1-15, wherein the height of each grating is from about 0.01 $\mu$m to about 25 $\mu$m.

Embodiment 17 provides the method of any one of embodiments 1-16, wherein the patterned film has a shape selected from serpentine lines, parallel zig-zag lines, grid structures, concentric circles, regular polygons, or combinations thereof.

Embodiment 18 provides the method of any one of embodiments 1-17, wherein the electrode has the shape of the patterned film.

Embodiment 19 provides the method of any one of embodiments 1-18, wherein the spacing between the shapes ranges from about 0.05 to about 100 $\mu$m.

Embodiment 20 provides the method of any one of embodiments 1-19, wherein the grating pattern comprises annealed $TiO_2$ nanoparticles.

Embodiment 21 provides the method of any one of embodiments 1-20, wherein the method further comprises planarizing the electrode by depositing at least one layer of a crosslinkable pre-polymer photoresist on the electrode, followed by curing to form a planarized layer.

Embodiment 22 provides the method of any one of embodiments 1-21, wherein the method further comprises forming additional electrodes by performing additional cycles of the depositing, the stamping, the annealing, the planarizing, and the curing; wherein in each successive cycle the parallel grating pattern is formed perpendicular to and overlapping the previously deposited grating pattern.

Embodiment 23 provides the method of any one of embodiments 1-22, wherein up to six total electrode layers are deposited to form a three-dimensional electrode.

Embodiment 24 provides the method of any one of embodiments 1-23, wherein the three-dimensional electrode is substantially free of organic material after curing.

Embodiment 25 provides the method of any one of embodiments 1-24, wherein the three-dimensional electrode has a porosity of about 25% to about 35% as calculated by the Lorentz-Lorentz equation.

Embodiment 26 provides the method of any one of embodiments 1-25, wherein the specific capacity of the three-dimensional electrode is proportional to the number of electrode layers.

Embodiment 27 provides the method of any one of embodiments 1-26, wherein the capacity of a single electrode layer is from about 6.0 to about 9.0 $\mu$Ah.

Embodiment 28 provides the method of any one of embodiments 1-27, wherein the areal energy density of a single electrode layer is from about 4.0 to about 7.0 $\mu Whcm^{-2}$.

Embodiment 29 provides a battery comprising the electrode of any one of embodiments 1-28, a counter electrode, and a liquid electrolyte that permeates the electrode of any one of embodiments 1.

Embodiment 30 provides a method of fabricating electrodes, comprising: spin-coating an ink comprising about 3 wt % $TiO_2$ nanoparticles, having number-averaged and volume-averaged particle sizes of about 1 nm to about 25 nm, dispersed in an alcohol solvent on a gold contact formed on a silicon dioxide substrate to form a film; stamping the film with a mold to form a film having a parallel grating pattern, wherein the grating pattern has a spacing of about 1 $\mu m$, and each grating has a height of about 0.01 $\mu m$ to about 0.25 $\mu m$ and a width of about 0.01 $\mu m$ to about 0.25 $\mu m$; annealing the patterned film to form an electrode layer; planarizing the electrode by depositing at least one layer of a crosslinkable pre-polymer photoresist on the electrode layer, followed by curing the photoresist to form a planarized layer; and forming at least five additional electrodes by additional cycles of the spin-coating, the stamping, the annealing, the planarizing, and the curing; wherein in each successive cycle the parallel grating pattern is formed perpendicular to and overlapping the previously deposited grating pattern.

Embodiment 31 provides a method of fabricating electrodes, comprising: depositing a first ink comprising electroactive nanoparticles, and optionally at least one conductive additive, on a substrate to form a film; stamping the film with a mold to form a stamped structure; annealing the stamped structure to form a first electrode; depositing on the first electrode at least one layer of a separator; backfilling the stamped structure with a second ink comprising electroactive nanoparticles to form a second electrode.

Embodiment 32 provides the method of any one of embodiments 31, wherein the substrate is glass.

Embodiment 33 provides the method of any one of embodiments 31-32, wherein the glass has an indium tin oxide (ITO) electrical contact.

Embodiment 34 provides the method of any one of embodiments 31-33, wherein the depositing comprises spin-coating.

Embodiment 35 provides the method of any one of embodiments 31-34, wherein the spin-coating is performed at about 200 to about 800 rpm.

Embodiment 36 provides the method of any one of embodiments 31-35, wherein the stamped structure is a parallel grating.

Embodiment 37 provides the method of any one of embodiments 31-36, wherein the stamped structure has a shape selected from serpentine lines, parallel zig-zag lines, grid structures, concentric circles, regular polygons, or combinations thereof.

Embodiment 38 provides the method of any one of embodiments 31-37, wherein the first electrode has the shape of the patterned film.

Embodiment 39 provides the method of any one of embodiments 31-38, wherein the spacing between the shapes ranges from about 0.05 to about 100 $\mu m$.

Embodiment 40 provides the method of any one of embodiments 31-39, wherein the first electrode is the cathode and the second electrode is the anode.

Embodiment 41 provides the method of any one of embodiments 31-40, wherein the first electrode is the anode and the second electrode is the cathode.

Embodiment 42 provides the method of any one of embodiments 31-41, wherein the first ink comprises a dispersion of metal oxide nanoparticles.

Embodiment 43 provides the method of any one of embodiments 31-42, wherein the metal oxide nanoparticles have number-averaged and volume-averaged particle sizes of about 1 nm to about 25 nm.

Embodiment 44 provides the method of any one of embodiments 31-43, wherein the metal oxide nanoparticles are crystalline.

Embodiment 45 provides the method of any one of embodiments 31-44, wherein metal oxide nanoparticles comprise about 1 to about 25 wt % of the dispersion.

Embodiment 46 provides the method of any one of embodiments 31-45, wherein the metal oxide nanoparticles are $LiMn_2O_4$ (LMO).

Embodiment 47 provides the method of any one of embodiments 31-46, wherein the dispersion comprises an organic solvent.

Embodiment 48 provides the method of any one of embodiments 31-47, wherein the organic solvent comprises methanol and N-methyl-2-pyrrolidone.

Embodiment 49 provides the method of any one of embodiments 31-48, wherein the dispersion comprises 4-hydroxybenzoic acid.

Embodiment 50 provides the method of any one of embodiments 31-49, wherein the second ink comprises a dispersion of metal oxide nanoparticles.

Embodiment 51 provides the method of any one of embodiments 31-50, wherein the dispersion comprises mesoporous carbon and an organic solvent.

Embodiment 52 provides the method of any one of embodiments 31-51, wherein the organic solvent comprises a mixture of de-ionized water, ethanol, and ethylene glycol.

Embodiment 53 provides the method of any one of embodiments 31-52, wherein the de-ionized water, ethanol, and ethylene glycol are present in a 16:8:1 v/v ratio.

Embodiment 54 provides the method of any one of embodiments 31-53, wherein the dispersion further comprises an aqueous polymer binder.

Embodiment 55 provides the method of any one of embodiments 31-54, wherein the binder is polyvinylpyrrolidone.

Embodiment 56 provides the method of any one of embodiments 31-55, wherein the mesoporous carbon, the metal oxide nanoparticles, and the binder are present in a 1:1:1 ratio.

Embodiment 57 provides the method of any one of embodiments 31-56, wherein the metal oxide nanoparticles are $Li_4Ti_5O_{12}$ (LTO).

Embodiment 58 provides the method of any one of embodiments 31-57, wherein the spacing between the gratings is about 0.05 to about 100 $\mu m$.

Embodiment 59 provides the method of any one of embodiments 31-58, wherein the height of each grating is from about 0.5 to about 25 $\mu m$.

Embodiment 60 provides the method of any one of embodiments 31-59, wherein the width of each grating is from about 0.5 $\mu m$ to about 25 $\mu m$.

Embodiment 61 provides the method of any one of embodiments 31-60, wherein the separator is a polymer separator.

Embodiment 62 provides the method of any one of embodiments 31-61, wherein the polymer separator is deposited using spin-coating.

Embodiment 63 provides the method of any one of embodiments 31-62, wherein the polymer separator comprises the polymerization product of a UV-curable slide-ring resin in a propylene glycol methyl ether acetate (PGMEA) solution.

Embodiment 64 provides the method of any one of embodiments 31-63, wherein the polymer separator adheres to the first electrode.

Embodiment 65 provides the method of any one of embodiments 31-64, wherein the second ink coats the separator.

Embodiment 66 provides the method of any one of embodiments 31-65, wherein the dispersion has a viscosity of about 1.0 to 5.0 mPa s.

Embodiment 67 provides the method of any one of embodiments 31-66, wherein the separator is deposited from the vapor phase or by ionized chemical vapor deposition (CVD).

Embodiment 68 provides the method of any one of embodiments 31-67, wherein the separator comprises at least one poly(p-xylene) polymer.

Embodiment 69 provides the method of any one of embodiments 31-68, wherein the depositing comprises grafting a polymer onto the first electrode.

Embodiment 70 provides the method of any one of embodiments 31-69, wherein the grafting results in covalent bonding between the at least one polymer and the first electrode.

Embodiment 71 provides the method of any one of embodiments 31-70, wherein the grafting results in a non-covalent bonding between the at least one polymer and the first electrode.

Embodiment 72 provides the method of any one of embodiments 31-71, wherein the grafting comprises polymerization of monomers initiated by an active site on the first electrode or by an initiating site deposited on the first electrode.

Embodiment 73 provides the method of any one of embodiments 31-72, wherein the separator is deposited on the first electrode by electrochemical polymerization.

Embodiment 74 provides a method of fabricating electrodes, comprising: depositing a first ink comprising electroactive nanoparticles, and optionally at least one conductive additive, on a substrate to form a film; depositing a separator layer on the film to form a bilayer; stamping the bilayer with a mold to form a stamped structure; annealing the stamped structure to form a first electrode; backfilling the stamped structure with a second ink comprising electroactive nanoparticles to form a second electrode.

Embodiment 75 provides the method of any one of embodiments 31-74, wherein the separator layer comprises monomers, macromonomers, or a prepolymer.

Embodiment 76 provides the method of any one of embodiments 31-75, wherein the separator layer comprises a polymer.

Embodiment 77 provides the method of any one of embodiments 31-76, wherein the separator layer is crosslinked or cured.

Embodiment 78 provides the method of any one of embodiments 31-77, wherein the separator layer is partially crosslinked or partially cured.

Embodiment 79 provides the method of any one of embodiments 31-78, wherein the separator layer is further crosslinked or cured after stamping.

Embodiment 80 provides the method of any one of embodiments 31-79, wherein the separator layer comprises porous particles.

Embodiment 81 provides the method of any one of embodiments 31-80, wherein the porous particles are organic or inorganic.

Embodiment 82 provides a battery comprising the electrodes of any one of embodiments 31-81 and a liquid electrolyte.

Embodiment 83 provides a method of fabricating electrodes, comprising: spin-coating a first ink comprising 4-hydroxybenzoic acid and 10 wt % of LMO nanoparticles dispersed in a mixture of methanol and N-methyl-2-pyrrolidone on an ITO substrate to form a film; stamping the film with a mold to form a parallel grating structure; wherein the grating structure has a spacing of about 10 µm, and each grating has a height of about 0.25 µm to about 2.5 µm and a width of about 2 µm to about 6 µm; annealing the grating structure to form a cathode; spin-coating the cathode with a solution of poly (dopamine acrylamide)-co-poly (ethylene glycol) methyl ether methacrylate (PDMA-co-PEG$_{500}$), to form a polymer separator; backfilling the spaces between the grating in the parallel grating structure with a second ink comprising LTO nanoparticles, mesoporous carbon, and polyvinylpyrrolidone in a dispersion of de-ionized water, ethanol, and ethylene glycol to form an anode.

Embodiment 84 provides an electrode made by the method of any one of embodiments 1-30.

Embodiment 85 provides an electrode made by the method of any one of embodiments 31-83.

Embodiment 86 provides an electronic device comprising at least one electrode made by the method of any one of embodiments 1-30.

Embodiment 87 provides an electronic device comprising at least one electrode made by the method of any one of embodiments 31-83.

What is claimed is:

1. A method of fabricating an electrode, comprising:
   depositing an ink comprising electroactive nanoparticles on a substrate comprising an electrical contact to form a film, wherein the depositing of the ink on the substrate comprises spin-coating, wherein the electroactive nanoparticles comprise LiMn$_2$O$_4$ (LMO), Li$_4$Ti$_5$O$_{12}$ (LTO), or a combination thereof;
   stamping the film with a mold to form a patterned film comprising a grating pattern;
   thermally annealing the patterned film to form the electrode; and
   planarizing the electrode comprising
      depositing at least one layer of a crosslinkable pre-polymer on the electrode, and
      curing the crosslinkable pre-polymer to form a planarized layer.

2. The method of claim 1, wherein the grating pattern is a parallel grating pattern.

3. The method of claim 1, wherein the grating pattern has a spacing of 0.01 microns to 25 microns.

4. The method of claim 1, wherein a grating of the grating pattern has a thickness of 0.01 microns to 25 microns and a height of 0.01 microns to 25 microns.

5. The method of claim 1, wherein the ink further comprises a conductive additive.

6. The method of claim 1, wherein the ink comprises a dispersion comprising the electroactive nanoparticles.

7. The method of claim 6, wherein the electroactive nanoparticles comprise number-averaged and volume-averaged particle sizes of about 1 nm to about 25 nm.

8. The method of claim 6, wherein the electroactive nanoparticles further comprise TiO$_2$.

9. The method of claim 6, wherein the electroactive nanoparticles are crystalline.

10. The method of claim 6, wherein the electroactive nanoparticles are about 1 wt % to about 25 wt % of the dispersion.

11. The method of claim 1, wherein the thermal annealing comprises annealing at a temperature of at least 70° C.

12. The method of claim 1, wherein the electrode has the shape of the patterned film.

13. The method of claim 1, further comprising forming additional electrodes by performing additional cycles of the depositing, the stamping, the annealing, the planarizing, and the curing.

14. The method of claim 13, wherein in each successive cycle a substantially parallel grating pattern is formed substantially perpendicular to and overlapping a previously deposited and adjacent grating pattern, wherein the method forms a multilayer or stacked structure of the grating patterns with the grating patterns substantially perpendicular and alternating in orientation.

15. A method of fabricating an electrode, comprising:
depositing an ink comprising electroactive nanoparticles on a substrate comprising an electrical contact to form a film, wherein the depositing of the ink on the substrate comprises spin-coating, wherein the electroactive nanoparticles comprise $LiMn_2O_4$ (LMO), $Li_4Ti_5O_{12}$ (LTO), or a combination thereof;
stamping the film with a mold to form a patterned film comprising a grating pattern;
thermally annealing the patterned film to form the electrode;
depositing on the electrode at least one layer of a separator; and
backfilling the electrode having the separator layer thereon with a second ink comprising electroactive nanoparticles that are the same as or different from the electroactive nanoparticles in the first ink, to form a second electrode.

16. The method of claim 15, wherein the depositing of the at least one layer of the separator on the first electrode comprises grafting a polymer onto the first electrode.

* * * * *